(12) United States Patent
Jang et al.

(10) Patent No.: US 7,521,715 B2
(45) Date of Patent: Apr. 21, 2009

(54) NODE CONTACT STRUCTURES IN SEMICONDUCTOR DEVICES

(75) Inventors: Jae-Hoon Jang, Gyeonggi-do (KR);
Soon-Moon Jung, Gyeonggi-do (KR);
Kun-Ho Kwak, Gyeonggi-do (KR);
Byung-Jun Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/032,725

(22) Filed: Jan. 11, 2005

(65) Prior Publication Data

US 2005/0151276 A1 Jul. 14, 2005

(30) Foreign Application Priority Data

Jan. 12, 2004  (KR) ...................... 10-2004-0002080

(51) Int. Cl.
*H01L 27/108* (2006.01)
(52) U.S. Cl. .......................................... 257/69; 257/903
(58) Field of Classification Search .................. 257/69, 257/74, 347, 350, 351, 903; 438/149, 479, 438/517, 152, 155, 156, 309, 311, 153, 154, 438/300
See application file for complete search history.

(56) References Cited

U.S. PATENT DOCUMENTS

| | | | |
|---|---|---|---|
| 4,808,546 A * | 2/1989 | Moniwa et al. ............. | 438/166 |
| 5,128,732 A | 7/1992 | Sugahara et al. | |
| 5,159,416 A | 10/1992 | Kudoh | |
| 5,278,459 A | 1/1994 | Matsui et al. | |
| 5,334,863 A | 8/1994 | Ohkawa et al. | |
| 5,426,324 A | 6/1995 | Rajeevakumar | |
| 5,432,129 A | 7/1995 | Hodges | |
| 5,506,802 A * | 4/1996 | Kiyono ........................ | 365/156 |

(Continued)

FOREIGN PATENT DOCUMENTS

JP            04-118967            4/1992

(Continued)

OTHER PUBLICATIONS

Wolf, Stanley, "Silicon Processing for the VLSI Era, vol. 3: The Submicron MOSFET", Lattice Press, California, 1995, pp. 288-313. ISBN: 0-961672-5-3.*

(Continued)

*Primary Examiner*—Thao X Le
*Assistant Examiner*—Ajay K Arora
(74) *Attorney, Agent, or Firm*—Myers Bigel Sibley & Sajovec, P.A.

(57) ABSTRACT

A static random-access memory (SRAM) device may include a bulk MOS transistor on a semiconductor substrate having a source/drain region therein, an insulating layer on the bulk MOS transistor, and a thin-film transistor having a source/drain region therein on the insulating layer above the bulk MOS transistor. The device may further include a multi-layer plug between the bulk MOS transistor and the thin-film transistor. The multi-layer plug may include a semiconductor plug directly on the source/drain region of the bulk MOS transistor and extending through at least a portion of the insulating layer, and a metal plug directly on the source/drain region of the thin-film transistor and the semiconductor plug and extending through at least a portion of the insulating layer. Related methods are also discussed.

48 Claims, 22 Drawing Sheets

U.S. PATENT DOCUMENTS

| | | | |
|---|---|---|---|
| 5,675,185 A | 10/1997 | Chen et al. | 257/774 |
| 5,804,470 A * | 9/1998 | Wollesen | 438/141 |
| 5,831,285 A * | 11/1998 | Takeuchi et al. | 257/69 |
| 6,022,766 A | 2/2000 | Chen et al. | 438/152 |
| 6,037,207 A * | 3/2000 | Asano et al. | 438/241 |
| 6,153,458 A * | 11/2000 | Zamanian et al. | 438/238 |
| 6,255,151 B1 * | 7/2001 | Fukuda et al. | 438/197 |
| 6,316,370 B1 * | 11/2001 | Mercaldi et al. | 438/745 |
| 6,569,715 B1 * | 5/2003 | Forbes | 438/138 |
| 6,620,659 B2 * | 9/2003 | Emmma et al. | 438/154 |
| 6,731,007 B1 * | 5/2004 | Saito et al. | 257/762 |
| 2001/0035557 A1 * | 11/2001 | Park et al. | 257/371 |
| 2004/0144979 A1 * | 7/2004 | Bhattacharyya | 257/67 |
| 2005/0248035 A1 * | 11/2005 | Son et al. | 257/758 |

FOREIGN PATENT DOCUMENTS

| | | |
|---|---|---|
| KR | 1999-0055063 | 7/1999 |
| KR | 000053530 | 8/2000 |
| KR | 1020010039882 A | 5/2001 |
| KR | 1020020075065 A | 10/2002 |
| KR | 1020040000352 A | 1/2004 |
| TW | 294832 | 1/1997 |
| TW | 366567 | 8/1999 |

OTHER PUBLICATIONS

Office Action corresponding to German Patent Application No. 10-2005-001134.9-33 mailed on Oct. 17, 2006.

Office Action corresponding to Korean Patent Application No. 10-2004-0002080 mailed on Jan. 6, 2006.

* cited by examiner

NODE CONTACT STRUCTURES IN SEMICONDUCTOR DEVICES

CROSS-REFERENCE TO RELATED APPLICATION

This application claims priority under 35 U.S.C. § 119 from Korean Patent Application No. 10-2004-0002080, filed on Jan. 12, 2004, the disclosure of which is hereby incorporated by reference herein in its entirety.

BACKGROUND OF THE INVENTION

1. Field of the Invention

The present invention relates to semiconductor devices and, more particularly, to contact structures in semiconductor devices.

2. Description of the Related Art

In semiconductor memory devices, a static random access memory (SRAM) device may offer advantages of lower power consumption and faster operating speed as compared to a dynamic random access memory (DRAM) device. Therefore, the SRAM may be widely used for cache memory in computers and/or other portable devices.

A unit cell of a SRAM device may be categorized as either a resistor-load SRAM cell or a complementary metal-oxide semiconductor (CMOS) SRAM cell. A resistor-load SRAM cell may employ a high-resistance resistor as a load device, while a CMOS SRAM cell may employ a p-channel metal-oxide semiconductor (PMOS) transistor as a load device.

The CMOS SRAM cell may be categorized as one of two types. One type of CMOS SRAM cell is a thin film transistor (TFT) SRAM cell, which may employ TFTs stacked on a semiconductor substrate as the load device. The other is a bulk CMOS SRAM cell, which may employ bulk transistors formed on a semiconductor substrate as the load device.

The bulk CMOS SRAM cell may exhibit higher cell stability as compared to the TFT SRAM cell and the resistor-load SRAM cell. In other words, the bulk CMOS SRAM cell may have excellent low voltage characteristics and low standby current. This may be because the transistors that make up the bulk CMOS SRAM cell are typically formed of a single crystalline silicon substrate. In contrast, the TFTs of the TFT SRAM cell are typically formed using a polysilicon layer as a body layer. However, the bulk CMOS SRAM cell may have lower integration density as well as weaker latch-up immunity as compared to the TFT SRAM cell. Therefore, in order to produce a highly integrated SRAM device having high reliability, characteristics of load transistors employed in the TFT SRAM cell may need to be improved.

In addition, each of the SRAM cells may include a pair of node contact structures. More particularly, in the TFT SRAM cell, each of the node contact structures may electrically connect a P-type drain region of a load transistor to an N-type drain region of a driver transistor.

Semiconductor devices having TFTs stacked on a semiconductor substrate are described in U.S. Pat. No. 6,022,766 to Chen et al. According to Chen et al., an improved field effect transistor (FET) structure comprises a first insulator layer containing at least one primary level stud extending through the layer; an undoped cap oxide layer disposed over the insulator layer and abutting the upper region of each stud; a primary level thin film transistor (TFT) disposed over the undoped cap oxide layer; and a planarized oxide layer disposed over the TFT. Multiple TFTs can be stacked vertically, and connected to other levels of studs and metal interconnection layers. Chen also discloses a protective interfacial cap over the surface of tungsten-type studs. The FET structure can serve as a component of a static random access memory (SRAM) cell.

Furthermore, a body layer of a TFT may be formed by depositing an amorphous silicon layer on the semiconductor substrate having the metal plug, and by crystallizing the amorphous silicon layer using a thermal treatment process. The body layer may be a polysilicon layer having large grains. As such, it may be difficult to convert the body layer into a perfect single crystalline silicon layer. Consequently, it may be difficult to form TFTs having electrical characteristics comparable to that of a bulk transistor.

SUMMARY OF THE INVENTION

According to some embodiments of the present invention, a static random-access memory (SRAM) device may include a bulk MOS transistor on a semiconductor substrate having a source/drain region therein, an insulating layer on the bulk MOS transistor, and a thin-film transistor having a source/drain region therein on the insulating layer above the bulk MOS transistor. The device may further include a multi-layer plug including a semiconductor plug extending through at least a portion of the insulating layer and directly on the source/drain region of the bulk MOS transistor, and a metal plug extending through at least a portion of the insulating layer and directly on the source/drain region of the thin-film transistor and the semiconductor plug.

In some embodiments, the semiconductor plug and the source/drain region of the bulk MOS transistor may be a same conductivity type. Also, the source/drain region of the bulk MOS transistor and the source/drain region of the thin-film transistor may be different conductivity types. In particular, the semiconductor plug and the source/drain region of the bulk MOS transistor may be an n-type conductivity, while the source drain region of the thin film transistor may be a p-type conductivity.

In other embodiments, the metal plug may be directly on the source/drain region of the bulk MOS transistor and at least one sidewall of the semiconductor plug. The semiconductor plug may be an intrinsic semiconductor and/or a different conductivity type than the source/drain region of the bulk MOS transistor. In particular, the semiconductor plug may be a p-type conductivity, while the source/drain region of the bulk MOS transistor may be an n-type conductivity.

In some embodiments, the semiconductor plug may be directly on the source/drain region of the thin-film transistor.

In other embodiments, the bulk MOS transistor may be an n-channel metal oxide semiconductor (NMOS) transistor, and the thin film MOS transistor may be a p-channel metal oxide semiconductor (PMOS) transistor.

In some embodiments, the thin-film transistor may be a first thin-film transistor. The device may further include a second thin-film transistor on the insulating layer adjacent the first thin-film transistor. The metal plug may be directly on a gate electrode of the second thin-film transistor.

In other embodiments, the bulk MOS transistor may be a first bulk MOS transistor, and the metal plug may be a first metal plug. The device may further include a second bulk MOS transistor on the substrate adjacent the first bulk MOS transistor, and a second metal plug extending through at least a portion of the insulating layer. The second metal plug may be directly on the gate electrode of the second thin-film transistor and a gate electrode of the second bulk MOS transistor. The gate electrode of the second bulk MOS transistor may be an n-type polysilicon pattern, and the gate electrode of the second thin-film transistor may be a p-type polysilicon pattern.

In some embodiments, the bulk MOS transistor may be a driver transistor, the first thin-film transistor may be a load transistor, and the second thin-film transistor may be a transfer transistor for the SRAM device. A word line may be connected to the gate electrode of the second thin-film transistor, and a bit line may be connected to a source/drain region of the second thin-film transistor.

In other embodiments, the insulating layer on the bulk MOS transistor is a first insulating layer. The device may further include a second insulating layer on the thin-film transistor, and the metal plug may extend through the second insulating layer.

In some embodiments, the thin-film transistor may include a body portion having a single crystalline silicon structure. The body portion of the thin-film transistor may be formed by a solid phase epitaxial process, and may have a same crystalline structure as the semiconductor plug.

In other embodiments, the metal plug is a tungsten plug. The metal plug may further include barrier metal layer surrounding the tungsten plug.

According to further embodiments of the present invention, a method of forming a semiconductor device may include forming a bulk MOS transistor on a semiconductor substrate having a source/drain region therein, forming an insulating layer on the bulk MOS transistor, and forming a semiconductor plug directly on a source/drain region of the bulk MOS transistor and extending through at least a portion of the insulating layer. The method may further include forming a thin-film transistor having a source drain region therein on the insulating layer above the bulk MOS transistor, and forming a metal plug directly on the semiconductor plug and the source/drain region of the thin-film transistor and extending through at least a portion of the insulating layer.

In some embodiments, the semiconductor plug and the source/drain region of the bulk MOS transistor may be formed to have a same conductivity type, and the source/drain region of the bulk MOS transistor and the source/drain region of the thin-film transistor may be formed to have different conductivity types.

In other embodiments, forming the metal plug may further include forming the metal plug directly on the source/drain region of the bulk MOS transistor and at least one sidewall of the semiconductor plug. The semiconductor plug may be formed of an intrinsic semiconductor and/or a layer having a different conductivity type than the source/drain region of the bulk MOS transistor.

In some embodiments, forming the thin-film transistor may further include forming the source/drain region of the thin-film transistor directly on the semiconductor plug.

In other embodiments, the thin-film transistor may be a first thin-film transistor, the bulk MOS transistor may be a first bulk MOS transistor, and the metal plug may be a first metal plug. A second thin-film transistor may be formed on the insulating layer adjacent the first thin-film transistor. The second thin-film transistor may have a gate electrode directly on the first metal plug. A second bulk MOS transistor having a gate electrode may be formed on the substrate adjacent the first bulk MOS transistor; and a second metal plug may be formed extending through at least a portion of the insulating layer. The second metal plug may be formed directly on the gate electrode of the second thin-film transistor and a gate electrode of the second bulk MOS transistor.

In some embodiments, forming a thin-film transistor may include forming a conductive layer pattern on the insulating layer, and performing a solid phase epitaxial (SPE) process on the conductive layer pattern to form a thin-film transistor body pattern having a single crystalline structure. The solid phase epitaxial process may be performed at a temperature of about 500° C. to about 800° C. using the semiconductor plug as a seed layer. The semiconductor plug and the thin-film transistor body pattern may be formed of single crystalline silicon.

According to other embodiments of the present invention, an interconnection structure in a semiconductor device may include an insulating layer on an active region of a semiconductor substrate, a conductive layer pattern on the insulating layer, and a multi-layer plug. The multi-layer plug may include a semiconductor plug directly on the active region and extending through at least a portion of the insulating layer, and a metal plug directly on the semiconductor plug and the conductive layer pattern and extending through at least a portion of the insulating layer.

In some embodiments, the semiconductor plug and the active region may be a same conductivity type, and the active region and the conductive layer pattern may be different conductivity types. In particular, the semiconductor plug and the active region may be an n-type conductivity, and at least a portion of the conductive layer pattern may be a p-type conductivity.

In other embodiments, the metal plug may be directly on the active region and at least one sidewall of the semiconductor plug. The semiconductor plug may be an intrinsic semiconductor and/or a different conductivity type than the active region. In particular, the semiconductor plug may be a p-type conductivity, and the active region may be an n-type conductivity.

In some embodiments, the semiconductor plug may be directly on the conductive layer pattern. In particular, the semiconductor plug may be directly on a bottom surface of the conductive layer pattern, and the metal plug may be directly on a sidewall of the semiconductor plug and an end portion of the conductive layer pattern.

In other embodiments, the metal plug may pass through a portion of the conductive layer pattern, and the semiconductor plug may extend between the metal plug and the active region.

In some embodiments, the conductive layer pattern may be a first conductive layer pattern. The interconnection structure may further include a second conductive layer pattern on the insulating layer adjacent the first conductive layer pattern and directly on the metal plug.

In other embodiments, the conductive layer pattern and the semiconductor plug may be single crystalline silicon.

In some embodiments, the metal plug may be a metal layer having ohmic contact with both an n-type semiconductor and a p-type semiconductor.

Embodiments of the present invention are also directed to node contact structures in semiconductor devices. The node contact structures may include an isolation layer that is formed at a predetermined region of a semiconductor substrate to define an active region. The active region and the isolation layer may be covered with a lower interlayer insulating layer. A semiconductor plug may be provided in the lower interlayer insulating layer and extended to be in contact with the active region. A conductive layer pattern may be disposed on the lower interlayer insulating layer, and the conductive layer pattern and the lower interlayer insulating layer may be covered with an upper interlayer insulating layer. At least the conductive layer pattern and the semiconductor plug may be electrically connected to a metal plug that passes through the upper and lower interlayer insulating layers.

In some embodiments, the semiconductor plug may be a single crystalline semiconductor plug, and the conductive layer pattern may be a single crystalline semiconductor pattern.

In other embodiments, the semiconductor plug may be in contact with a bottom surface of the conductive layer pattern, and the metal plug may be in contact with a sidewall of the semiconductor plug and an end portion of the conductive layer pattern. The metal plug may be extended to be in contact with the active region.

In still other embodiments, the metal plug may pass through a portion of the conductive layer pattern to be in contact with the conductive layer pattern, and the semiconductor plug may be interposed between the metal plug and the active region. In addition, the metal plug may be extended to be in contact with a sidewall of the semiconductor plug and a surface of the active region.

According to other embodiments of the present invention, the node contact structures may include a lower gate electrode formed on a semiconductor substrate. The semiconductor substrate having the lower gate electrode may be covered with a lower interlayer insulating layer. An upper gate electrode may be provided on the lower interlayer insulating layer. The upper gate electrode and the lower interlayer insulating layer may be covered with an upper interlayer insulating layer. The upper and lower gate electrodes may be in contact with a metal plug that passes through the upper and lower interlayer insulating layers.

In some embodiments, the metal plug may pass through a portion of the upper gate electrode.

Some embodiments of the present invention may be directed to a semiconductor device employing node contact structures. The semiconductor device may include an isolation layer formed at a predetermined region of a semiconductor substrate to define an active region, and a bulk metal oxide semiconductor (MOS) transistor formed at the active region. The semiconductor substrate and the bulk MOS transistor may be covered with a lower interlayer insulating layer. A source/drain region of the bulk MOS transistor may be in contact with a semiconductor plug that is located in the lower interlayer insulating layer. A body pattern may be provided on the lower interlayer insulating layer. A thin film MOS transistor may be provided at the body pattern. The semiconductor substrate and the thin film MOS transistor may be covered with an upper interlayer insulating layer. At least a source/drain region of the thin film MOS transistor and the semiconductor plug may be in contact with a metal drain plug that passes through the upper and lower interlayer insulating layers.

In some embodiments, the bulk MOS transistor may include a lower gate electrode crossing over the active region, and the thin film MOS transistor may include an upper gate electrode crossing over the body pattern. The upper and lower gate electrodes may be electrically connected to each other through a metal gate plug that passes through the upper and lower interlayer insulating layers.

In other embodiments, the semiconductor plug may be in contact with a bottom surface of the body pattern, and the metal drain plug may be in contact with a sidewall of the semiconductor plug and an end portion of the body pattern. In addition, the metal drain plug may be extended to be in contact with the source/drain region of the bulk MOS transistor.

In yet other embodiments, the metal drain plug may pass through a portion of the body pattern to be in contact with the body pattern, and the semiconductor plug may be disposed between the metal drain plug and the source/drain region of the bulk MOS transistor. Furthermore, the metal drain plug may be extended to be in contact with the source/drain region of the bulk MOS transistor.

Some embodiments of the present invention may be directed to thin film transistor (TFT) static random access memory (SRAM) cells employing node contact structures. The TFT SRAM cells may include an isolation layer formed at a semiconductor substrate to define first and second active regions. A first transfer gate electrode and a first driver gate electrode may be provided to cross over the first active region. A second driver gate electrode and a second transfer gate electrode may be provided to cross over the second active region. The first transfer gate electrode may be adjacent to the second driver gate electrode, and the first driver gate electrode may be adjacent to the second transfer gate electrode. The semiconductor substrate including the transfer gate electrodes and the driver gate electrodes may be covered with a lower interlayer insulating layer. The first active region between the first driver gate electrode and the first transfer gate electrode may be electrically connected to a first node semiconductor plug passing through the lower interlayer insulating layer. Similarly, the second active region between the second driver gate electrode and the second transfer gate electrode may be electrically connected to a second node semiconductor plug passing through the lower interlayer insulating layer. A first body pattern may be provided to cross over the first driver gate electrode, and the first body pattern may be extended to be in contact with a top surface of the first node semiconductor plug. A second body pattern may be provided to cross over the second driver gate electrode, and the second body pattern may be extended to be in contact with a top surface of the second node semiconductor plug. A first load gate electrode may be provided to cross over the first body pattern. The first load gate electrode may be extended to overlap with or to be adjacent to the second body pattern on the second node semiconductor plug. A second load gate electrode may be provided to cross over the second body pattern. The second load gate electrode may be extended to overlap with or to be adjacent to the first body pattern on the first node semiconductor plug. The semiconductor substrate including the load gate electrodes may be covered with an upper interlayer insulating layer. The first body pattern, the second load gate electrode and the first node semiconductor plug may be electrically connected to a first metal drain plug that passes through the upper interlayer insulating layer, the second load gate electrode and the lower interlayer insulating layer. The second body pattern, the first load gate electrode and the second node semiconductor plug may be electrically connected to a second metal drain plug that passes through the upper interlayer insulating layer, the first load gate electrode and the lower interlayer insulating layer.

In some embodiments, the first and second node semiconductor plugs as well as the first and second body patterns may be single crystalline semiconductor patterns.

In other embodiments, the first driver gate electrode may be electrically connected to a first metal gate plug that passes through the upper interlayer insulating layer, the first load gate electrode and the lower interlayer insulating layer, and the second driver gate electrode may be electrically connected to a second metal gate plug that passes through the upper interlayer insulating layer, the second load gate electrode and the lower interlayer insulating layer.

According to further embodiments of the present invention, a TFT SRAM cell may include an isolation layer formed at a semiconductor substrate to define first and second active regions. A first transfer gate electrode and a first driver gate electrode may be provided to cross over the first active region. A second driver gate electrode and a second transfer gate electrode may be provided to cross over the second active region. The second driver gate electrode and the second transfer gate electrode may be disposed to be adjacent to the first transfer gate electrode and the first driver gate electrode, respectively. The semiconductor substrate including the transfer gate electrodes and the driver gate electrodes may be covered with a lower interlayer insulating layer. A first node semiconductor plug may be disposed in the lower interlayer insulating layer. The first node semiconductor plug is may be contact with the first active region between the first driver gate electrode and the first transfer gate electrode. A second node semiconductor plug may also be disposed in the lower interlayer insulating layer. The second node semiconductor plug may be in contact with the second active region between the second driver gate electrode and the second transfer gate electrode. A first body pattern may cross over the first driver gate electrode and extend to an upper region of the first node semiconductor plug. A second body pattern may cross over the second driver gate electrode and extend to an upper region of the second node semiconductor plug. A first load gate electrode may cross over the first body pattern and may extend to overlap with or to be adjacent to the second body pattern on the second node semiconductor plug. Similarly, a second load gate electrode may cross over the second body pattern and may extend to overlap with or to be adjacent to the first body pattern on the first node semiconductor plug. The semiconductor substrate and the load gate electrodes may be covered with an upper interlayer insulating layer. The first node semiconductor plug may be electrically connected to a first metal drain plug that passes through the upper interlayer insulating layer, the second load gate electrode, the first body pattern and the lower interlayer insulating layer. The second node semiconductor plug may be electrically connected to a second metal drain plug that passes through the upper interlayer insulating layer, the first load gate electrode, the second body pattern and the lower interlayer insulating layer.

In some embodiments, the first and second node semiconductor plugs as well as the first and second body patterns may be single crystalline semiconductor patterns.

In other embodiments, the first driver gate electrode may be electrically connected to a first metal gate plug which passes through the upper interlayer insulating layer, the first load gate electrode and the lower interlayer insulating layer, and the second driver gate electrode may be electrically connected to a second metal gate plug which passes through the upper interlayer insulating layer, the second load gate electrode and the lower interlayer insulating layer.

Some embodiments of the present invention may be directed to a method of fabricating a semiconductor device employing a node contact structure. The method may include forming an isolation layer at a predetermined region of a semiconductor substrate to define an active region. A lower interlayer insulating layer may be formed on the isolation layer and the active region. The lower interlayer insulating layer may be patterned to form a contact hole exposing the active region. A single crystalline semiconductor plug filling the contact hole may be formed using a selective epitaxial growth technique. An amorphous semiconductor layer and/or a polycrystalline semiconductor layer may be formed on the lower interlayer insulating layer and the semiconductor plug. The semiconductor layer may be patterned to form a semiconductor pattern covering the semiconductor plug. The semiconductor pattern may be crystallized using a solid phase epitaxial technique.

In some embodiments, the semiconductor substrate may be a single crystalline silicon substrate. The single crystalline semiconductor plug may be a single crystalline silicon plug, and the semiconductor layer may be formed of an amorphous silicon layer or a polycrystalline silicon layer.

In other embodiments, the solid phase epitaxial process may be performed at a temperature of about 500° C. to 800° C.

DETAILED DESCRIPTION OF THE INVENTION

Figure 1:
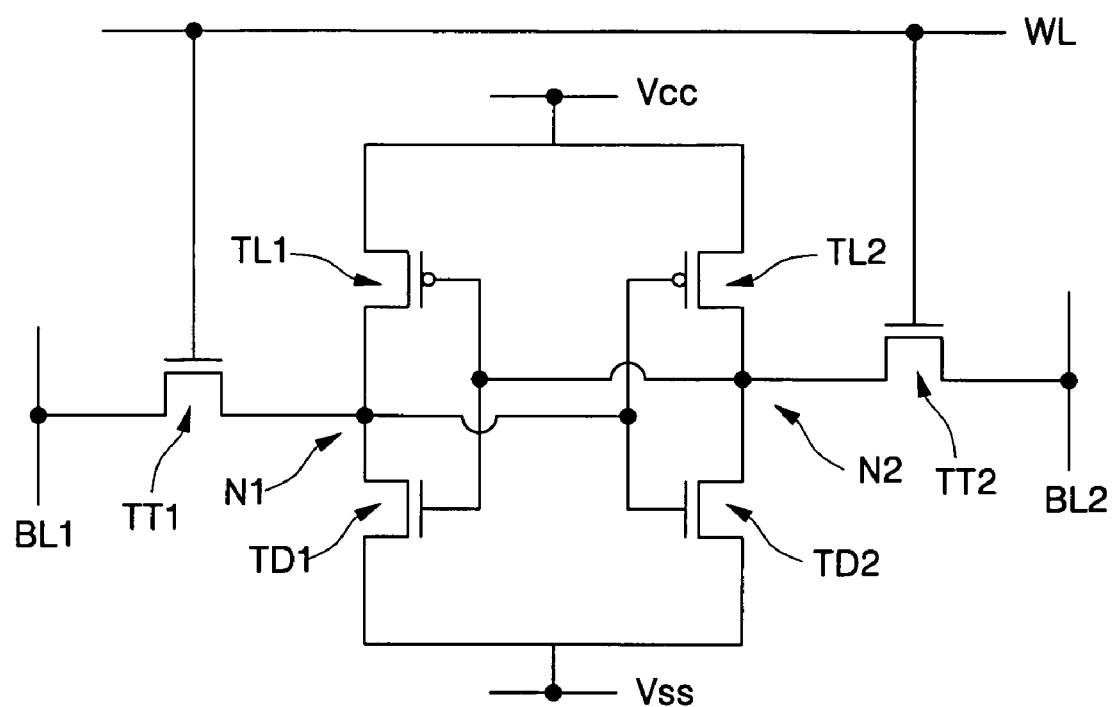
FIG. 1 illustrates a conventional equivalent circuit diagram of a complementary metal oxide semiconductor (CMOS) static random access memory (SRAM) cell.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

FIG. 1 is an equivalent circuit diagram of a conventional complementary metal oxide semiconductor (CMOS) static random access memory (SRAM) cell such as a thin film transistor (TFT) SRAM cell or a bulk CMOS SRAM cell.

Referring now to FIG. 1, a CMOS SRAM cell includes a pair of driver transistors TD1 and TD2, a pair of transfer transistors TT1 and TT2, and a pair of load transistors TL1 and TL2. The pair of driver transistors TD1 and TD2 and the pair of transfer transistors TT1 and TT2 are n-channel metal oxide semiconductor (NMOS) transistors, while the pair of load transistors TL1 and TL2 are p-channel metal oxide semiconductor (PMOS) transistors.

The first driver transistor TD1 and the first transfer transistor TT1 are serially connected to each other. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are serially connected to each other. A source region of the second driver transistor TD2 is electrically connected to the ground line Vss, and a drain region of the second transfer transistor TT2 is electrically connected to a second bit line BL2.

A source region and a drain region of the first load transistor TL1 are electrically connected to a power supply line Vcc and a drain region of the first driver transistor TD1, respectively. Similarly, a source region and a drain region of the second load transistor TL2 are electrically connected to the power supply line Vcc and the drain region of the second driver transistor TD2, respectively. The drain region of the first load transistor TL1, the drain region of the first driver transistor TD1, and the source region of the first transfer transistor TT1 correspond to a first node N1. Further, the drain region of the second load transistor TL2, the drain region of the second driver transistor TD2, and the source region of the second transfer transistor TT2 correspond to a second node N2. The gate electrode of the first driver transistor TD1 and the gate electrode of the first load transistor TL1 are electrically connected to the second node N2, and the gate electrode of the second driver transistor TD2 and the gate electrode of the second load transistor TL2 are electrically connected to the first node N1. The gate electrodes of the first and second transfer transistors TT1 and TT2 are electrically connected to a word line WL.

The CMOS SRAM cell described above may have a relatively small stand-by current, as well as a relatively large noise margin as compared to a resistor-load SRAM cell. As such, the CMOS SRAM cells may be widely employed in high performance SRAM with low power requirements. Moreover, the SRAM cell may include high performance p-channel thin film transistors (TFTs) as load resistors, which may offer improved electrical characteristics as compared to the p-channel bulk transistors used as load transistors in bulk CMOS SRAM cells. Accordingly, the TFT SRAM cell may offer advantages in terms of integration density and latch-up immunity, as compared to bulk CMOS SRAM cells.

In order to create a high performance p-channel TFT, the TFT may include a body pattern composed of a single crystalline semiconductor layer. In addition, an ohmic contact may be formed at the first and second nodes N1 and N2 shown in FIG. 1.

FIGS. 2 to 9 are plan views illustrating TFT SRAM cells according to some embodiments of the present invention. FIGS. 2 to 9 each illustrate four unit cells. In FIGS. 2 to 7, a pair of unit cells adjacent to each other along a y-axis may be symmetrical with respect to an x-axis. The pair of unit cells adjacent to each other along the y-axis may form a two-dimensional cell array along the x- and y-axes. Similarly, a pair of unit cells adjacent to each other along the x-axis may be symmetrical with respect to the y-axis.

FIGS. 10A, 11A, 12A, 13A, 14A, 15A, 16A and 17A are cross-sectional views taken along line I-I' of FIGS. 2 to 9 illustrating methods of fabricating TFT SRAM cells according to some embodiments of the present invention. Similarly, FIGS. 10B, 11B, 12B, 13B, 14B, 15B, 16B and 17B are cross-sectional views taken along line II-II' of FIGS. 2 to 9 illustrating methods of fabricating TFT SRAM cells according to some embodiments of the present invention.

Structures of TFT SRAM cells according to some embodiments of the present invention will now be described with reference to FIGS. 2 to 9, 17A and 17B.

Figure 2:
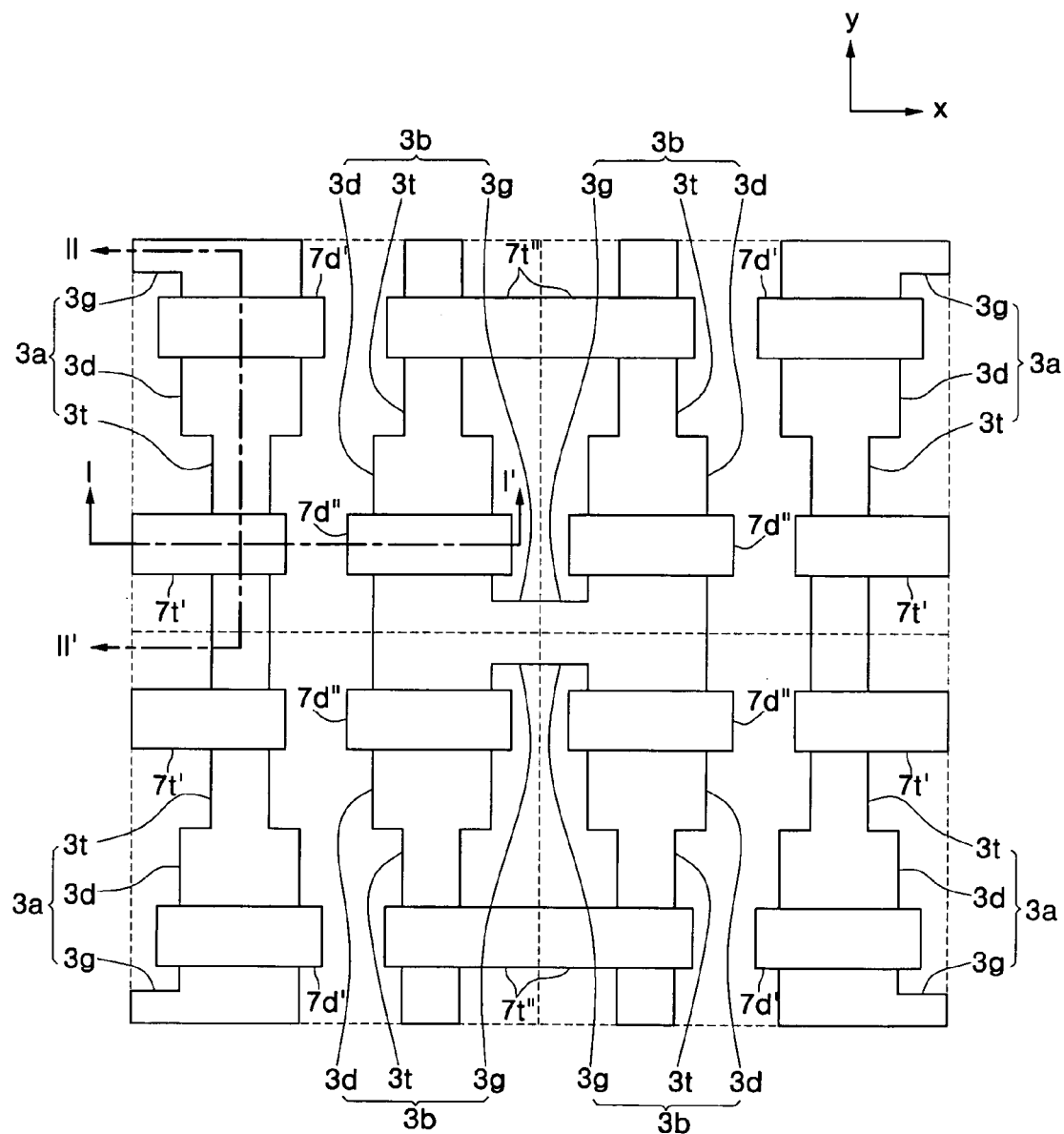
FIG. 2 is a plan view illustrating active regions, driver gate electrodes and transfer gate electrodes of CMOS SRAM cells according to some embodiments of the present invention.
Figure 17A:
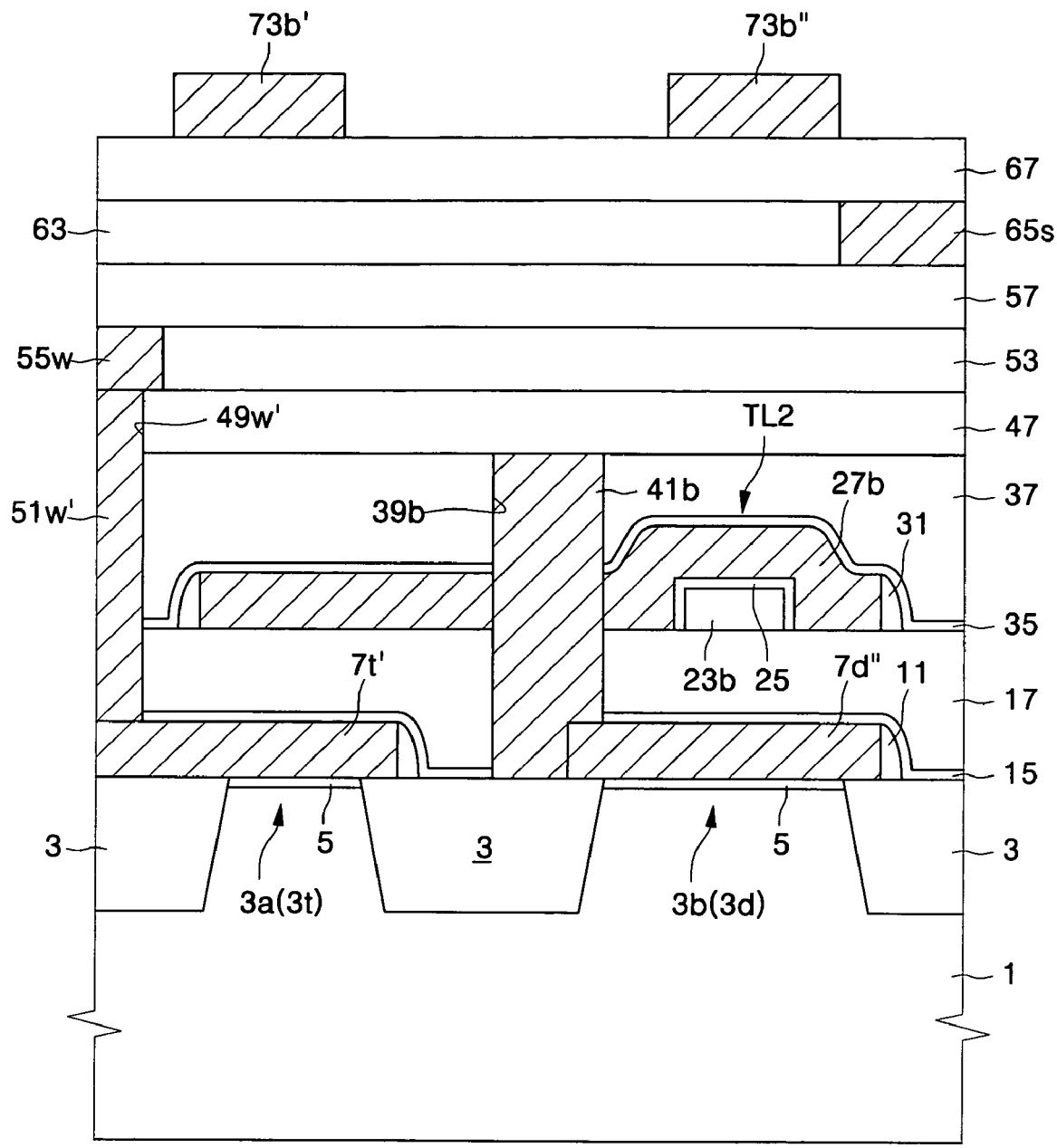
Figure 17B:
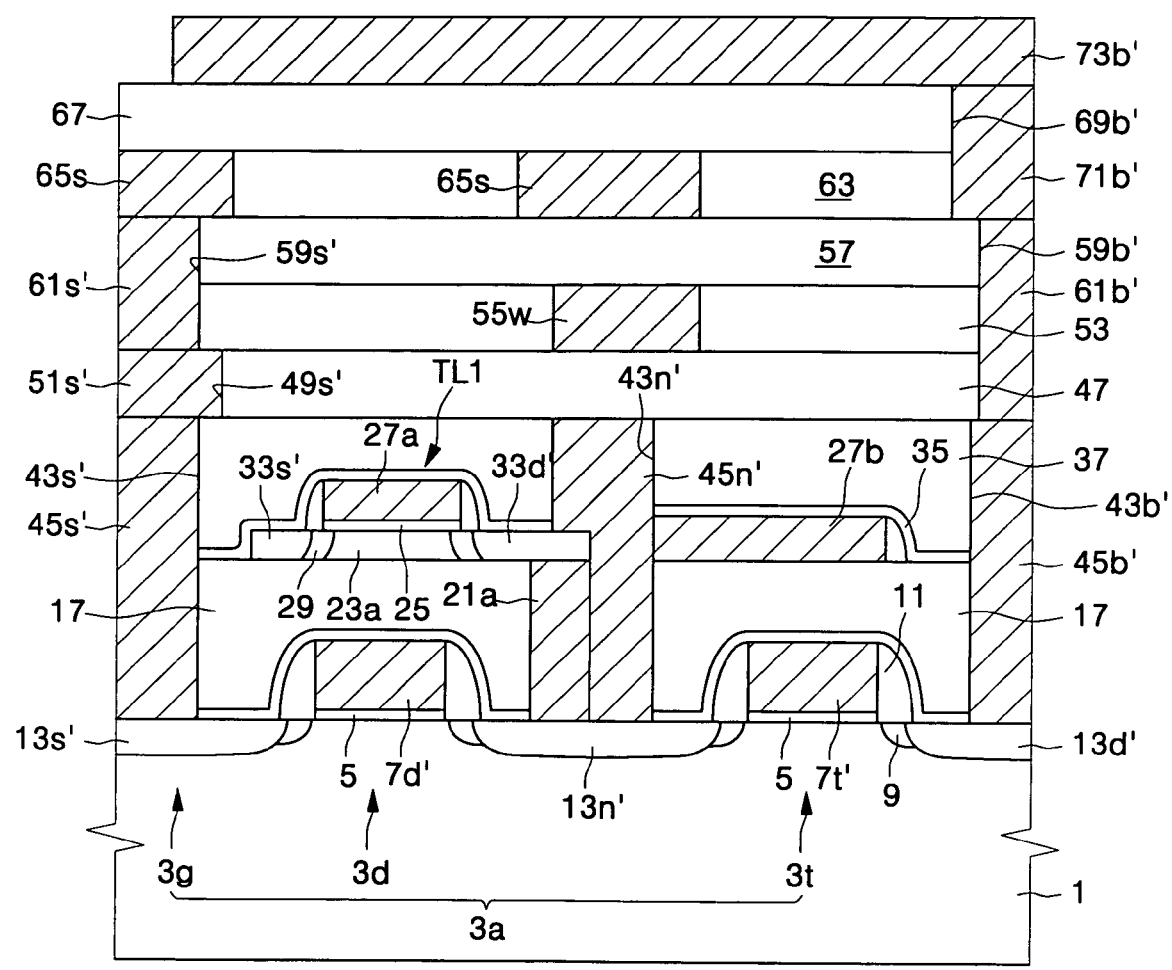

Referring to FIGS. 2, 17A and 17B, an isolation layer 3 is formed at a predetermined region of a semiconductor substrate 1 to define first and second active regions 3a and 3b. The semiconductor substrate 1 may be a single crystalline semiconductor substrate. For example, the semiconductor substrate 1 may be a single crystalline silicon substrate. The first and second active regions 3a and 3b are disposed to be parallel with a y-axis. Each of the first and second active regions 3a and 3b includes a transfer transistor active region 3t and a driver transistor active region 3d adjacent the transfer transistor active region 3t along the y-axis. In addition, each of the first and second active regions 3a and 3b may include a ground active region 3g which is adjacent an end portion of the driver transistor active region 3d toward a neighboring cell along an x-axis. The transfer transistor active region 3t of the first active region 3a is adjacent to the driver transistor active region 3d of the second active region 3b, and the driver transistor active region 3d of the first active region 3a is adjacent to the transfer transistor active region 3t of the second active region 3b. Accordingly, in one unit cell, the first active region 3a and the second active region 3b may be symmetrical with respect to a central point of the unit cell region.

A first driver gate electrode 7d' is formed to cross over the driver transistor active region 3d of the first active region 3a, and a first transfer gate electrode 7t' is formed to cross over the transfer transistor active region 3t of the first active region 3a. Similarly, a second driver gate electrode 7d" is formed to cross over the driver transistor active region 3d of the second active region 3b, and a second transfer gate electrode 7t" is formed to cross over the transfer transistor active region 3t of the second active region 3b. The second transfer gate electrode 7t" may be connected to another second transfer gate electrode of the adjacent unit cell along the x-axis, as shown in FIG. 2. Similarly, the first transfer gate electrode 7t' may be also connected to another first transfer gate electrode of the adjacent unit cell along the x-axis.

A first node impurity region 13n' is formed at a surface of the first active region 3a between the first driver gate electrode 7d' and the first transfer gate electrode 7t'. Also, a first ground impurity region 13s' is formed at a surface of the first active region 3a which is adjacent to the first driver gate electrode 7d' and opposite to the first node impurity region 13n', and a first bit line impurity region 13d' is formed at a surface of the first active region 3a adjacent to the first transfer gate electrode 7t' and opposite to the first node impurity region 13n'.

Similarly, a second node impurity region (not shown) is formed at a surface of the second active region 3b between the second driver gate electrode 7d" and the second transfer gate electrode 7t". A second ground impurity region (not shown) is also formed at a surface of the second active region 3b adjacent to the second driver gate electrode 7d" and opposite to the second node impurity region, and a second bit line impurity region (not shown) is formed at a surface of the second active region 3b adjacent to the second transfer gate electrode 7t" and opposite to the second node impurity region.

A gate insulation layer 5 is formed between the gate electrodes 7t', 7t", 7d' and 7d" and the active regions 3a and 3b. Sidewalls of the gate electrodes 7t', 7t", 7d' and 7d" may be covered by gate spacers 11. Lightly-doped drain (LDD) regions 9 may be formed in the active regions 3a and 3b below the gate spacers 11. The LDD regions 9 are connected to edges of the impurity regions 13s', 13n' and 13d'.

The first ground impurity region 13s', the first driver gate electrode 7d' and the first node impurity region 13n' form a first driver transistor (TD1 of FIG. 1). The first node impurity region 13n', the first transfer gate electrode 7t' and the first bit line impurity region 13d' form a first transfer transistor (TT1 of FIG. 1). As such, the first ground impurity region 13s' corresponds to a source region of the first driver transistor TD1, and the first bit line impurity region 13d' corresponds to a drain region of the first transfer transistor TT1. Consequently, the first node impurity region 13n' acts as a drain region of the first driver transistor TD1 and a source region of the first transfer transistor TT1.

Similarly, the second ground impurity region, the second driver gate electrode 7d" and the second node impurity region form a second driver transistor (TD2 of FIG. 1). The second node impurity region, the second transfer gate electrode 7t" and the second bit line impurity region form a second transfer transistor (TT2 of FIG. 1). As such, the second ground impurity region corresponds to a source region of the second driver transistor TD2, and the second bit line impurity region corresponds to a drain region of the second transfer transistor TT2. Consequently, the second node impurity region acts as a drain region of the second driver transistor TD2 and a source region of the second transfer transistor TT2. The driver transistors TD1 and TD2 and the transfer transistors TT1 and TT2 may be bulk metal oxide semiconductor (MOS) transistors formed on the semiconductor substrate 1.

In some embodiments, the driver transistors TD1 and TD2 and the transfer transistors TT1 and TT2 are NMOS transistors. In such a case, the impurity regions 13s', 13n' and 13d' and the LDD regions 9 correspond to N-type impurity regions, and the driver gate electrodes 7d' and 7d" and the transfer gate electrodes 7t' and 7t" may be N-type polysilicon patterns. The LDD regions 9 have a relatively low impurity concentration as compared to the impurity regions 13s', 13n' and 13d'.

A lower interlayer insulating layer 17 is formed on the semiconductor substrate having the transfer transistors TT1 and TT2 and the driver transistors TD1 and TD2. In addition, a lower etch stop layer 15 may be further formed between the transistors TT1, TT2, TD1 and TD2 and the lower interlayer insulating layer 17. The lower etch stop layer 15 may be an insulating layer having an etch selectivity with respect to the lower interlayer insulating layer 17. For example, when the lower interlayer insulating layer 17 is a silicon oxide layer, the lower etch stop layer 15 may be either a silicon nitride layer or a silicon oxynitride layer.

Figure 3:
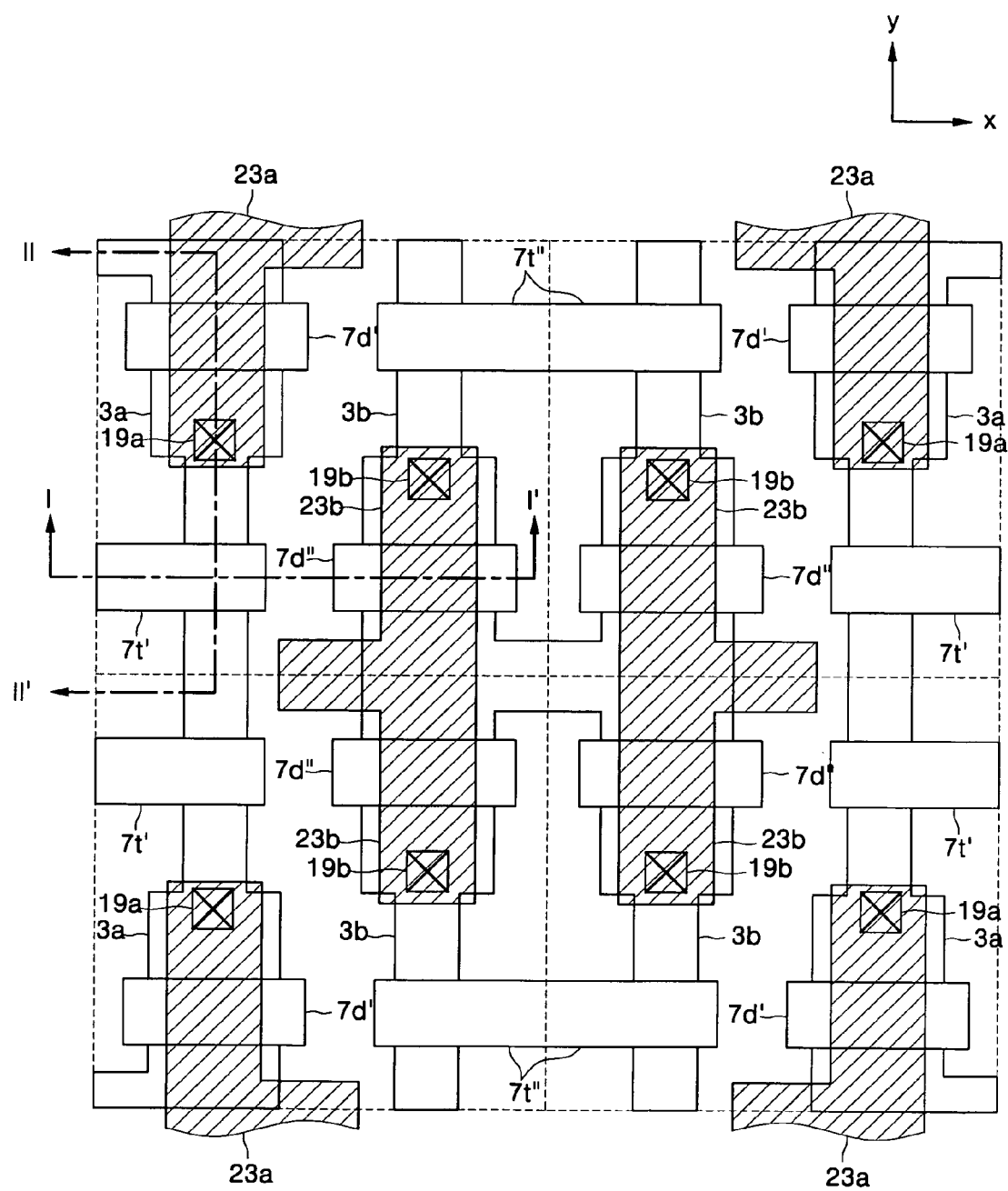
FIG. 3 is a plan view illustrating first and second single crystalline body layers as well as first and second node contact holes of CMOS SRAM cells according to some embodiments of the present invention.

Referring now to FIGS. 3, 17A and 17B, the first node impurity region 13n' is exposed by a first node contact hole 19a passing through the lower interlayer insulating layer 17. Similarly, the second node impurity region is also exposed by a second node contact hole 19b passing through the lower interlayer insulating layer 17. The first node contact hole 19a is filled with a first node semiconductor plug 21a, and the second node contact hole 19b is filled with a second node semiconductor plug (not shown). Accordingly, the first node semiconductor plug 21a is directly on the first node impurity region 13n', and the second node semiconductor plug is directly on the second node impurity region. The first and second node semiconductor plugs may be single crystalline semiconductor plugs. For example, when the semiconductor substrate 1 is a single crystalline silicon substrate, the node semiconductor plugs may be single crystalline silicon plugs. The node semiconductor plugs may have a conductivity type that is the same as or different from the node impurity regions. For example, the node semiconductor plugs may be either N-type or P-type. When the driver transistors TD1 and TD2 and the transfer transistors TT1 and TT2 are NMOS transistors, it may be preferable that the node semiconductor plugs are N-type. Alternatively, the node semiconductor plugs may be an intrinsic semiconductor.

First and second body patterns 23a and 23b are disposed on the lower interlayer insulating layer 17. The first and second body patterns 23a and 23b may be single crystalline semiconductor patterns. For example, when the node semiconductor plugs are single crystalline silicon plugs, the first and second body patterns 23a and 23b may be single crystalline silicon patterns. The first body pattern 23a is disposed to cross over the first driver gate electrode 7d' and extended to be in contact with a top surface of the first node semiconductor plug 21a. Similarly, the second body pattern 23b is disposed to cross over the second driver gate electrode 7d" and extended to be in contact with a top surface of the second node semiconductor plug.

Figure 4:
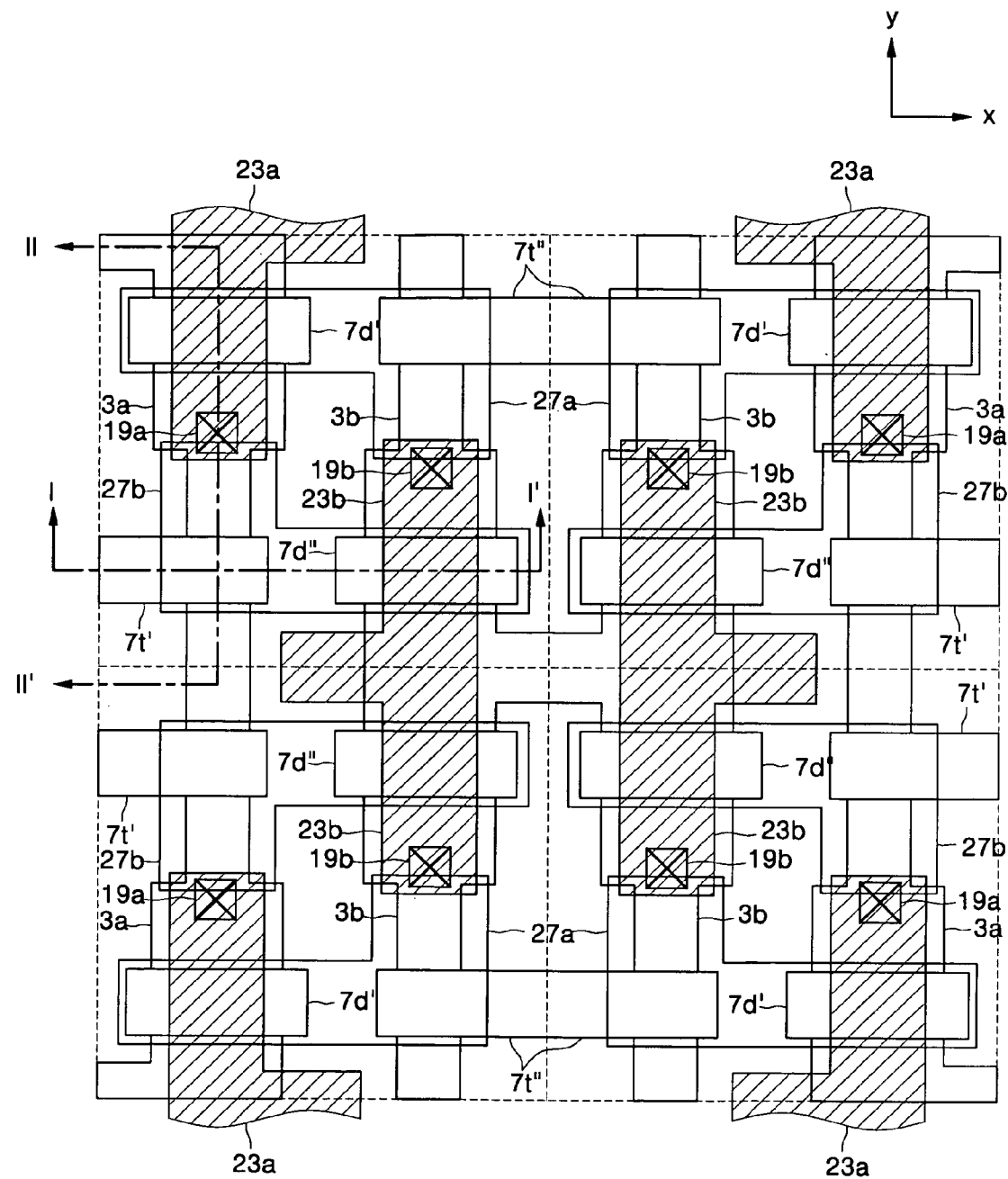
FIG. 4 is a plan view illustrating first and second load gate electrodes of CMOS SRAM cells according to some embodiments of the present invention.

Referring to FIGS. 4, 17A and 17B, a first load gate electrode 27a is disposed to cross over the first body pattern 23a, and a second load gate electrode 27b is disposed to cross over the second body pattern 23b. A gate insulating layer 25 is interposed between the body patterns 23a and 23b and the load gate electrodes 27a and 27b. The first load gate electrode 27a may be extended to overlap with and/or be adjacent the second body pattern 23b on the second node semiconductor plug. The second load gate electrode 27b may also be extended to overlap with and/or be adjacent the first body pattern 23a on the first node semiconductor plug 21a.

A first drain region 33d' is formed in the first body pattern 23a adjacent to the first load gate electrode 27a and in contact with the first node semiconductor plug 21a. As such, the first node semiconductor plug 21a is directly on the first drain region 33d'. Also, a first source region 33s' is formed in the first body pattern 23a adjacent to the first load gate electrode 27a and opposite the first drain region 33d'. Similarly, a second drain region (not shown) is formed in the second body pattern 23b adjacent to the second load gate electrode 27b and in contact with the second node semiconductor plug, and a second source region (not shown) is formed in the second body pattern 23b adjacent to the second load gate electrode 27b and opposite the second drain region. The first load gate electrode 27a, the first source region 33s' and the first drain region 33d' form a first load transistor (TL1 of FIG. 1). The second load gate electrode 27b, the second source region and the second drain region form a second load transistor (TL2 of FIG. 1). The load transistors TL1 and TL2 may be thin film MOS transistors formed at the body patterns 23a and 23b.

The load gate electrodes 27a and 27b may cover top surfaces of the body patterns 23a and 23b as well as sidewalls thereof, as shown in FIG. 17A. Therefore, load transistors TL1 and TL2 may offer advantages similar to that of a fin-type field effect transistor (FinFET). In other words, load transistors TL1 and TL2 may exhibit improved on-current drivability. For this reason, it may be possible not only to improve data retention characteristics related to low voltage operation characteristics of the SRAM cell, but also to reduce a soft error rate (SER) due to alpha particles.

Moreover, the sidewalls of the load gate electrodes 27a and 27b may be covered with gate spacers 31. LDD regions 29 may be provided in the body patterns 23a and 23b under the gate spacers 31. The LDD regions 29 are connected to edges of the source/drain regions 33s' and 33d'.

The load transistors TL1 and TL2 may be PMOS transistors. As such, the source and drain regions 33s' and 33d' and the LDD regions 29 may be P-type impurity regions, and the load gate electrodes 27a and 27b may be P-type polysilicon patterns. The LDD regions 29 may have a relatively low impurity concentration as compared to the source and drain regions 33s' and 33d'.

An upper interlayer insulating layer 37 is then formed on the semiconductor substrate including the load transistors TL1 and TL2. An upper etch stop layer 35 may be interposed between the load transistors TL1 and TL2 and the upper interlayer insulating layer 37. The upper etch stop layer 35 may be an insulating layer having an etch selectivity with respect to the upper interlayer insulating layer 37. For example, when the upper interlayer insulating layer 37 is a silicon oxide layer, the upper etch stop layer 35 may be either a silicon nitride layer or a silicon oxynitride layer.

Figure 5:
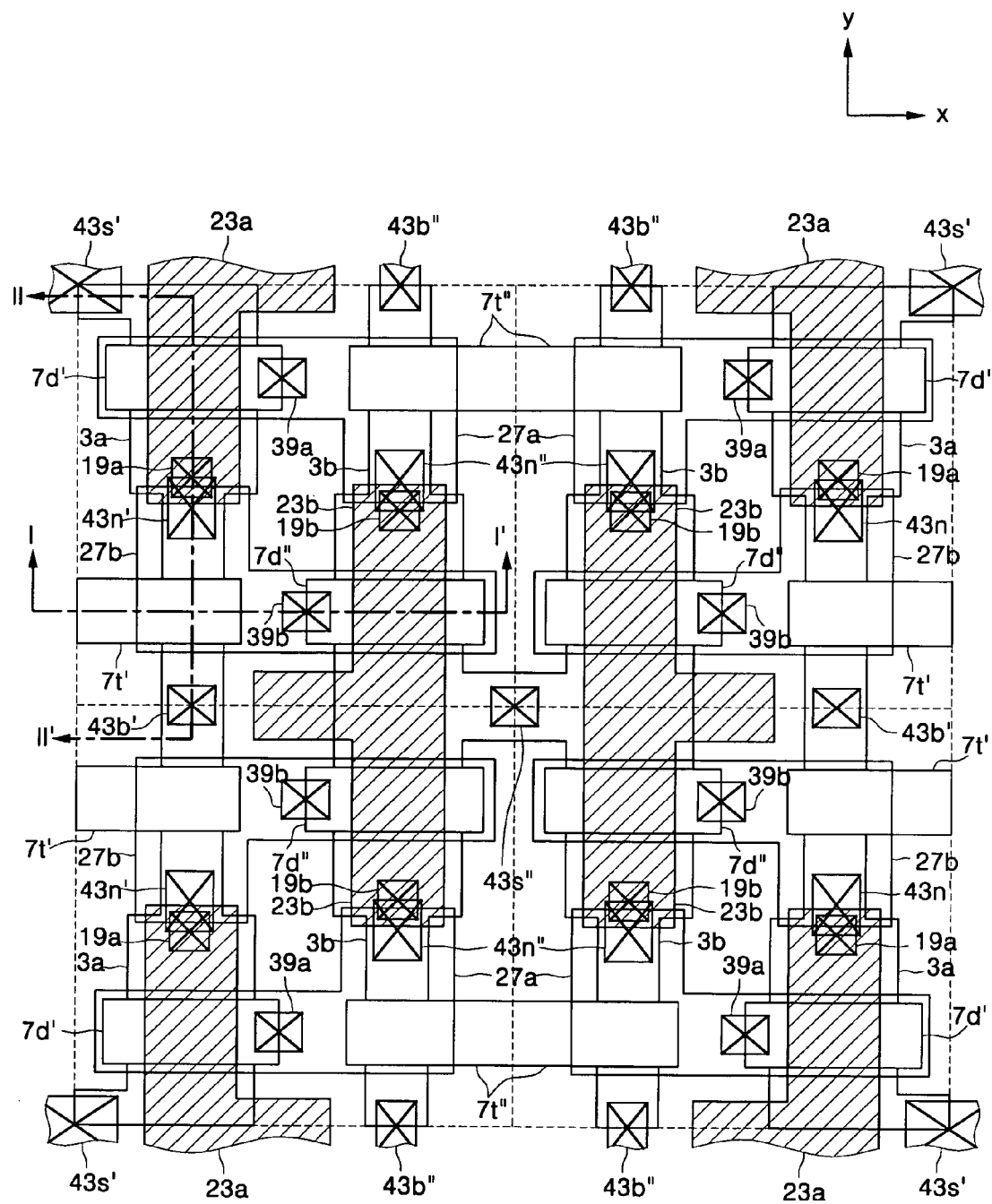
FIG. 5 is a plan view illustrating first and second drain contact holes, first and second gate contact holes, first and second lower ground line contact holes, and first and second lower bit line contact holes of CMOS SRAM cells according to some embodiments of the present invention.

Referring now to FIGS. 5, 17A and 17B, the first driver gate electrode 7d' and the first load gate electrode 27a are exposed by a first gate contact hole 39a which passes through the upper interlayer insulating layer 37, the upper etch stop layer 35, the first load gate electrode 27a, the lower interlayer insulating layer 17, and the lower etch stop layer 15. The first gate contact hole 39a is filled with a first metal gate plug (not shown). Similarly, the second driver gate electrode 7d" and the second load gate electrode 27b are exposed by a second gate contact hole 39b which passes through the upper interlayer insulating layer 37, the upper etch stop layer 35, the second load gate electrode 27b, the lower interlayer insulating layer 17, and the lower etch stop layer 15. The second gate contact hole 39b is filled with a second metal gate plug 41b. The first and second metal gate plugs may be formed of a metal layer chosen to provide an ohmic contact with respect to both a P-type semiconductor and an N-type semiconductor. For example, the metal gate plugs may be tungsten plugs. As such, the metal gate plugs may prevent PN junctions from being formed between the driver gate electrodes 7d' and 7d" and the load gate electrodes 27a and 27b.

The first drain region 33d', the first node semiconductor plug 21a and the second load gate electrode 27b are exposed by a first drain contact hole 43n' which passes through the upper interlayer insulating layer 37, the upper etch stop layer 35, the second load gate electrode 27b, and the lower interlayer insulating layer 17. The first drain contact hole 43n' is filled with a first metal drain plug 45n'. The second drain region, the second node semiconductor plug and the first load gate electrode 27a are exposed by a second drain contact hole 43n" which passes through the upper interlayer insulating layer 37, the upper etch stop layer 35, the first load gate electrode 27a and the lower interlayer insulating layer 17. The second drain contact hole 43n" is filled with a second metal drain plug (not shown). As a result, the first metal drain plug 45n' is electrically connected to the first drain region 33d', a sidewall of the first node semiconductor plug 21a, and the second load gate electrode 27b, and the second metal drain plug is electrically connected to the second drain region, a sidewall of the second node semiconductor plug, and the first load gate electrode 27a. In other words, the first metal drain plug 45n' is directly on the first drain region 33d', a sidewall of the first node semiconductor plug 21a, and the second load gate electrode 27b, and the second metal drain plug is directly on the second drain region, a sidewall of the second node semiconductor plug, and the first load gate electrode. The metal drain plugs may be formed of a metal chosen to provide an ohmic contact with respect to both a P-type semiconductor and an N-type semiconductor, as described above with respect to the metal gate plugs. For example, the metal drain plugs may be tungsten plugs.

The first metal drain plug 45n' may pass through the lower etch stop layer 15 to be in direct contact with the first node impurity region 13n', and the second metal drain plug may also pass through the lower etch stop layer 15 to be in contact with the second node impurity region. In other words, the first metal drain plug 45n' may be directly on the first node impurity region 13n', and the second metal drain plug may be directly on the second node impurity region. In particular, when the semiconductor plugs have a different conductivity type than the node impurity regions, or when the semiconductor plugs are composed of an intrinsic semiconductor, the first and second metal drain plugs may be extended to be directly on the first and second node impurity regions, respectively. For example, when the node impurity regions are N-type impurity regions and the semiconductor plugs are P-type semiconductors and/or intrinsic semiconductors, the first and second metal drain plugs may be extended to be in direct contact with the first and second node impurity regions, respectively. This may reduce contact resistance due to PN junctions between the node semiconductor plugs and the node impurity regions. As such, the first semiconductor plug 21a and the first metal drain plug 45n' form a first multi-layer plug between the first node impurity region 13n' and the first drain region 33d'. Similarly, the second semiconductor plug and the second metal drain plug form a second multi-layer plug between the second node impurity region and the second drain region.

The node semiconductor plugs, the metal drain plugs and the metal gate plugs complete a latch circuit which includes the first and second driver transistors TD1 and TD2 as well as the first and second load transistors TL1 and TL2. The first node impurity region 13n', the first node semiconductor plug 21a, the first drain region 33d', the first metal drain plug 45n' and the second load gate electrode 27b are electrically connected to each other, thereby forming a first drain node contact structure. Similarly, the second node impurity region, the second node semiconductor plug, the second drain region, the second metal drain plug and the first load gate electrode 27a are electrically connected to each other, thereby forming a second drain node contact structure.

Accordingly, a node contact structure may include a multi-layer plug extending through an insulating layer on a semi-conductor substrate and connecting a node impurity region in an active region of the substrate to a source/drain region in a conductive layer pattern on the insulating layer. More particularly, the multi-layer plug may include a semiconductor plug directly on the active region and extending through at least a portion of the insulating layer, and a metal plug directly on the semiconductor plug and the conductive layer pattern and extending through at least a portion of the insulating layer.

The first ground impurity region 13s' and the second ground impurity region are exposed by first and second lower ground line contact holes 43s' and 43s", respectively. The first lower ground line contact hole 43s' is filled with a first lower ground line contact plug 45s', and the second lower ground line contact hole 43s" is filled with a second lower ground line contact plug (not shown). Further, the first bit line impurity region 13d' and the second bit line impurity region are exposed by first and second lower bit line contact holes 43b' and 43b", respectively. The first lower bit line contact hole 43b' is filled with a first lower bit line contact plug 45b', and the second lower bit line contact hole 43b" is filled with a second lower bit line contact plug (not shown).

The lower ground line contact plugs and the lower bit line contact plugs may also be tungsten plugs, like the metal gate plugs and the metal drain plugs. Alternatively, each of the metal gate plugs, the lower ground line contact plugs, the lower bit line contact plugs and the metal drain plugs may include a tungsten plug as well as a barrier metal layer pattern surrounding a sidewall and a bottom surface of the tungsten plug.

The semiconductor substrate including the metal drain plugs and the metal gate plugs is then covered with a first insulating layer 47.

Figure 6:
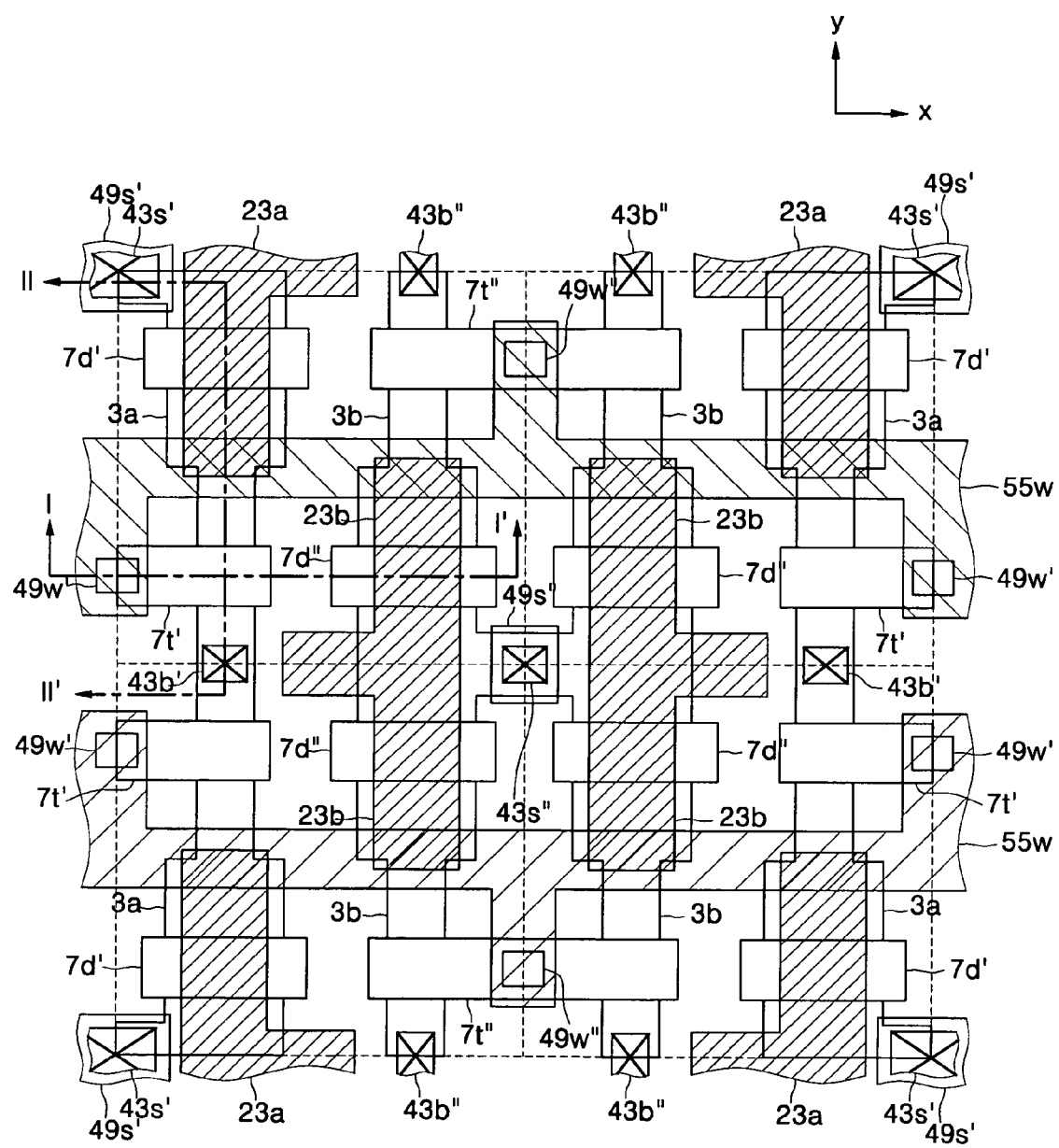
FIG. 6 is a plan view illustrating first and second intermediate ground line contact holes, first and second word line contact holes, and word lines of CMOS SRAM cells according to some embodiments of the present invention.

Referring now to FIGS. 6, 17A and 17B, the first lower ground line contact plug 45s' is exposed by a first intermediate ground line contact hole 49s' which passes through the first insulating layer 47. The second lower ground line contact plug is exposed by a second intermediate ground line contact hole 49s" which passes through the first insulating layer 47. The first intermediate ground line contact hole 49s' is filled with a first intermediate ground line contact plug 51s', and the second intermediate ground line contact hole 49s" is filled with a second intermediate ground line contact plug (not shown). Also, the first and second transfer gate electrodes 7t' and 7t" are respectively exposed by first and second word line contact holes 49w' and 49w" that pass through the first insulating layer 47, the upper interlayer insulating layer 37, the upper etch stop layer 35, the lower interlayer insulating layer 17, and the lower etch stop layer 15. The first word line contact hole 49w' is filled with a first word line contact plug 51w', and the second word line contact hole 49w" is filled with a second word line contact plug (not shown).

The surface of the semiconductor substrate including the word line contact plugs and the intermediate ground line contact plugs is then covered with a second insulating layer 53. Word lines 55w are disposed within the second insulating layer 53. The word lines 55w are disposed to cross over the first and second active regions 3a and 3b. The word lines 55w are in contact with top surfaces of the first and second word line contact plugs. The word lines 55w and the second insulating layer 53 are covered with a third insulating layer 57.

Figure 7:
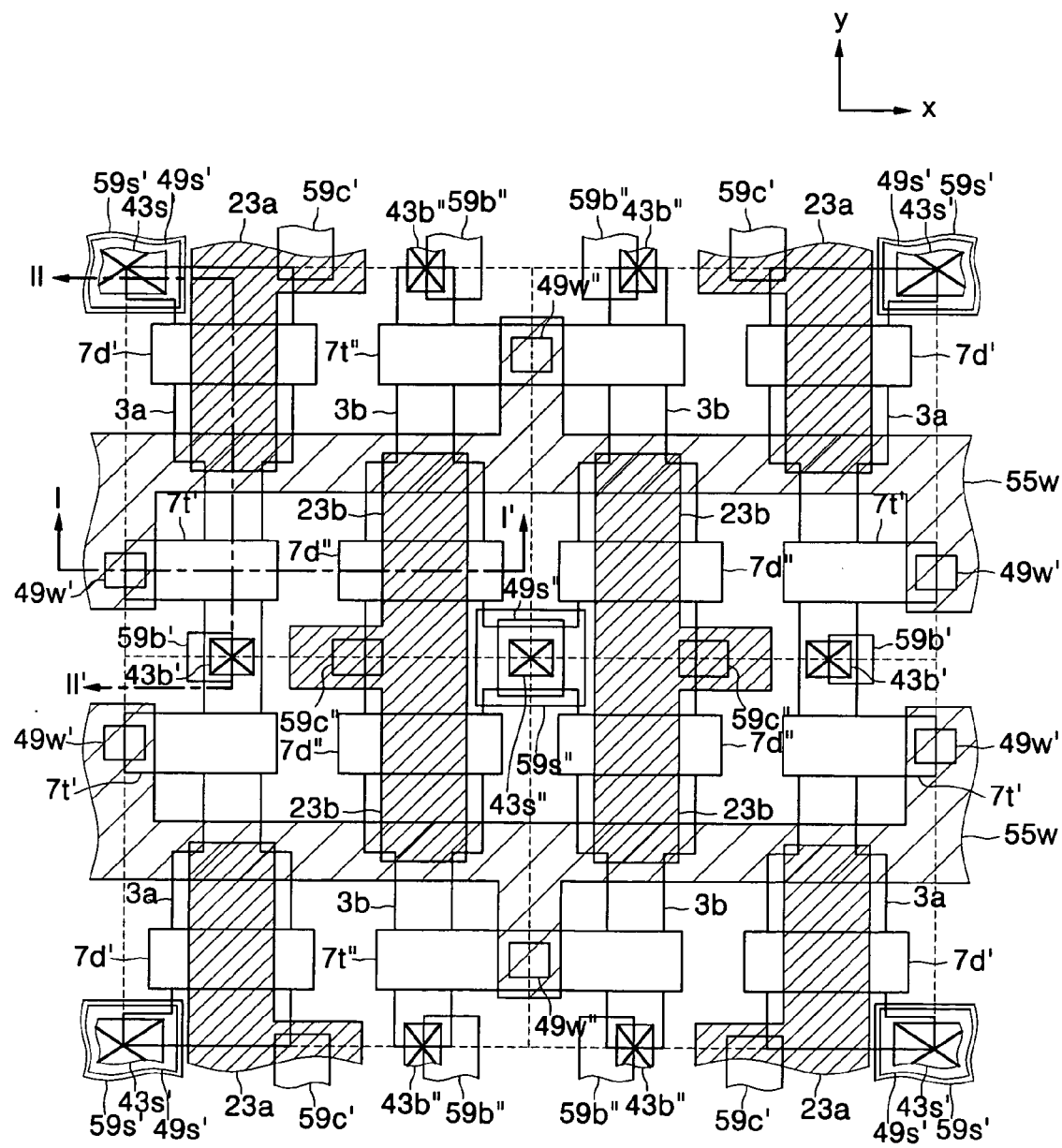
FIG. 7 is a plan view illustrating first and second upper ground line contact holes, first and second power line contact holes, and first and second intermediate bit line contact holes of CMOS SRAM cells according to some embodiments of the present invention.

Referring to FIGS. 7, 17A and 17B, the first intermediate ground line contact plug 51s' and the second intermediate ground line contact plug are respectively exposed by first and second upper ground line contact holes 59s' and 59s" that pass through the third insulating layer 57 and the second insulating layer 53. The first upper ground line contact hole 59s' is filled with a first upper ground line contact plug 61s', and the second upper ground line contact hole 59s" is filled with a second upper ground line contact plug (not shown). Also, the first lower bit line contact plug 45b' and the second lower bit line contact plug are respectively exposed by first and second intermediate bit line contact holes 59b' and 59b" that pass through the first to third insulating layers 47, 53 and 57. The first intermediate bit line contact hole 59b' is filled with a first intermediate bit line contact plug 61b', and the second intermediate bit line contact hole 59b" is filled with a second intermediate bit line contact plug (not shown).

The first source region 33s' of the first load transistor TL1 is exposed by a first power line contact hole 59c' which passes through the upper interlayer insulating layer 37, the upper etch stop layer 35, and the first to third insulating layers 47, 53 and 57. Similarly, the second source region of the second load transistor TL2 is exposed by a second power line contact hole 59c" which passes through the upper interlayer insulating layer 37, the upper etch stop layer 35, and the first to third insulating layers 47, 53 and 57. The first and second power line contact holes 59c' and 59c" are filled with first and second power line contact plugs (not shown), respectively.

The surface of the semiconductor substrate including the power line contact plugs is then covered with a fourth insulating layer 63.

Figure 8:
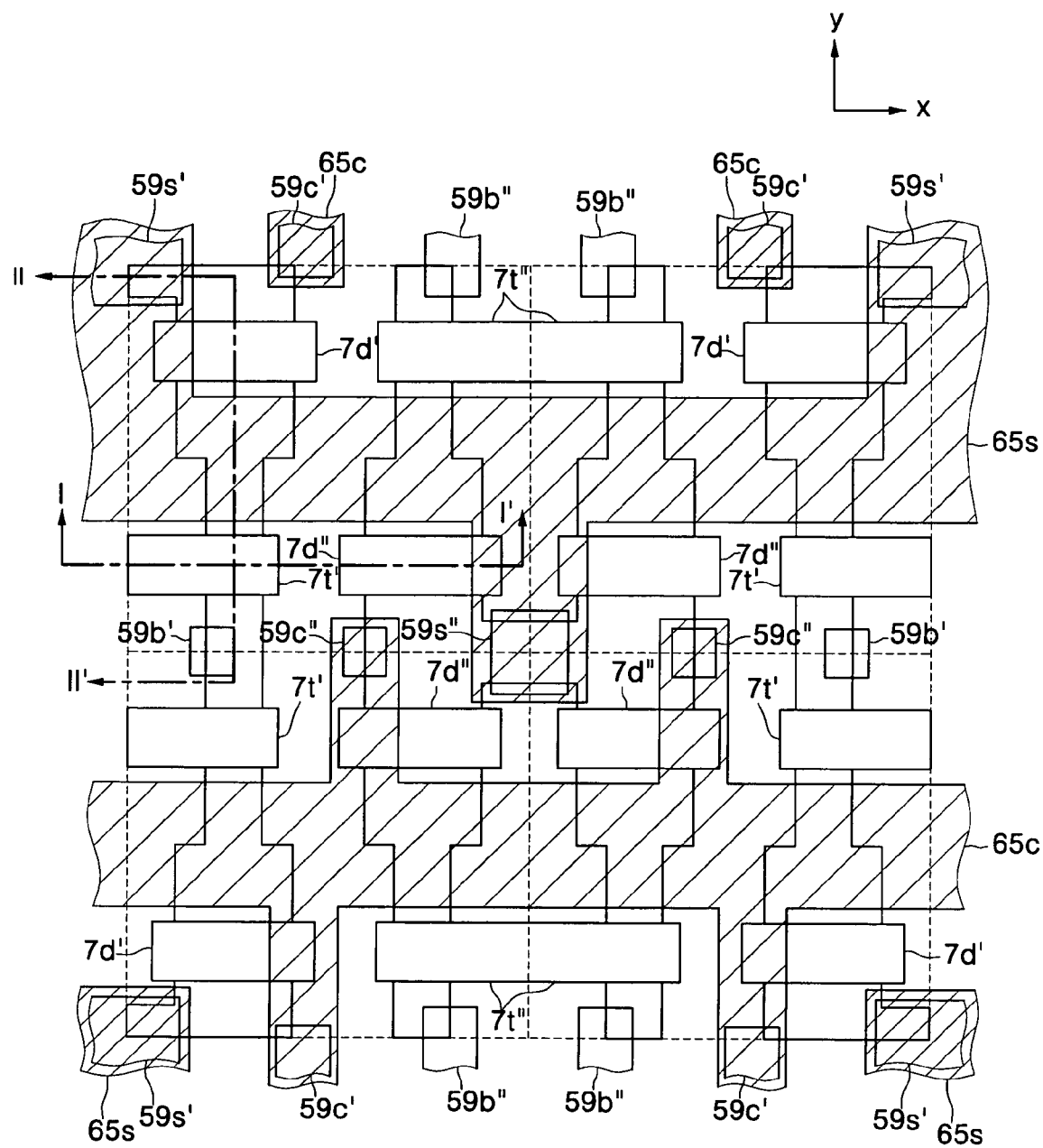
FIG. 8 is a plan view illustrating power and ground lines of CMOS SRAM cells according to some embodiments of the present invention.

FIG. 8 is a plan view illustrating power and ground lines of CMOS SRAM cells according to some embodiments of the present invention. In FIG. 8, some of the elements shown in FIG. 7, for example, the body patterns 23a and 23b, the lower bit line contact holes 43b' and 43b", the lower ground line contact holes 43s' and 43s", the intermediate ground line contact holes 49s' and 49s," and the word lines 55w, are not shown in order to avoid complexity.

Referring now to FIGS. 8, 17A and 17B, power lines 65c and ground lines 65s may be disposed in the fourth insulating layer 63. As shown in FIG. 8, the SRAM cells may form a two-dimensional array having rows and columns which are parallel to the x- and y-axes, respectively. The power lines 65c may be disposed on SRAM cells in the even rows of the array, and the ground lines 65s may be disposed on the SRAM cells in the odd rows of the array. As a result, the power line 65c and the ground line 65s may be disposed to cross over the first and second active regions 3a and 3b and may be alternately and repeatedly arrayed. The power lines 65c are electrically connected to the first and second power line contact plugs, and the ground lines 65s are electrically connected to the first and second upper ground line contact plugs.

The ground lines 65s, the power lines 65c and the fourth insulating layer 63 are then covered with a fifth insulating layer 67.

Figure 9:
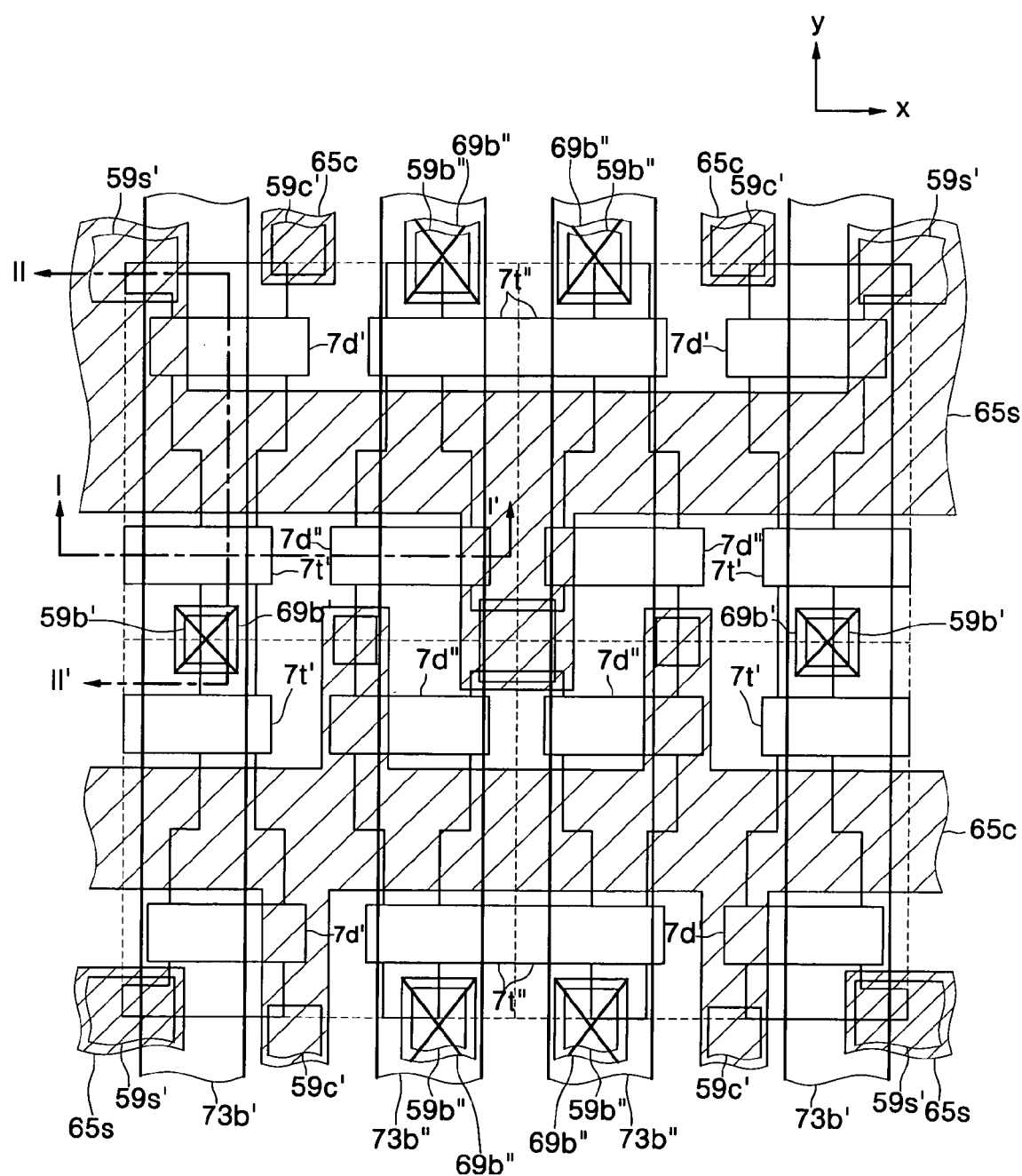
FIG. 9 is a plan view illustrating first and second upper bit line contact holes as well as first and second bit lines of CMOS SRAM cells according to some embodiments of the present invention.

Referring now to FIGS. 9, 17A and 17B, the first intermediate bit line contact plug 61b' may be exposed by a first upper bit line contact hole 69b' which passes through the fourth and fifth insulating layers 63 and 67, and the second intermediate bit line contact plug may be exposed by a second upper bit line contact hole 69b" which passes through the fourth and fifth insulating layers 63 and 67. The first upper bit line contact hole 69b' is filled with a first upper bit line contact plug 71b', and the second upper bit line contact hole 69b" is filled with a second upper bit line contact plug (not shown).

First and second parallel bit lines 73b' and 73b" are disposed on the fifth insulating layer 67. The first and second bit lines 73b' and 73b" are disposed to cross over the power lines 65c and ground lines 65s. The first bit line 73b' is electrically connected to the first upper bit line contact plug 71b', and the second bit line 73b" is electrically connected to the second upper bit line contact plug.

The first and second drain node contact structures described with reference to FIGS. 5, 17A and 17B may be modified to include various different configurations in addition to those described herein.

Figure 13A:
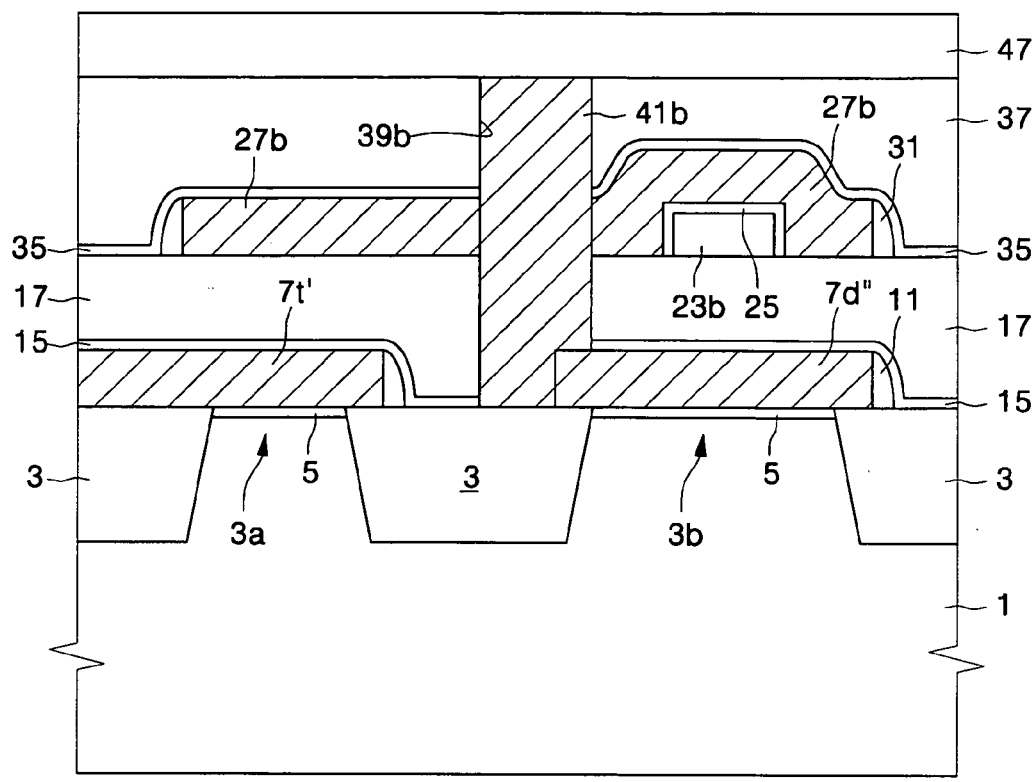
Figure 13B:
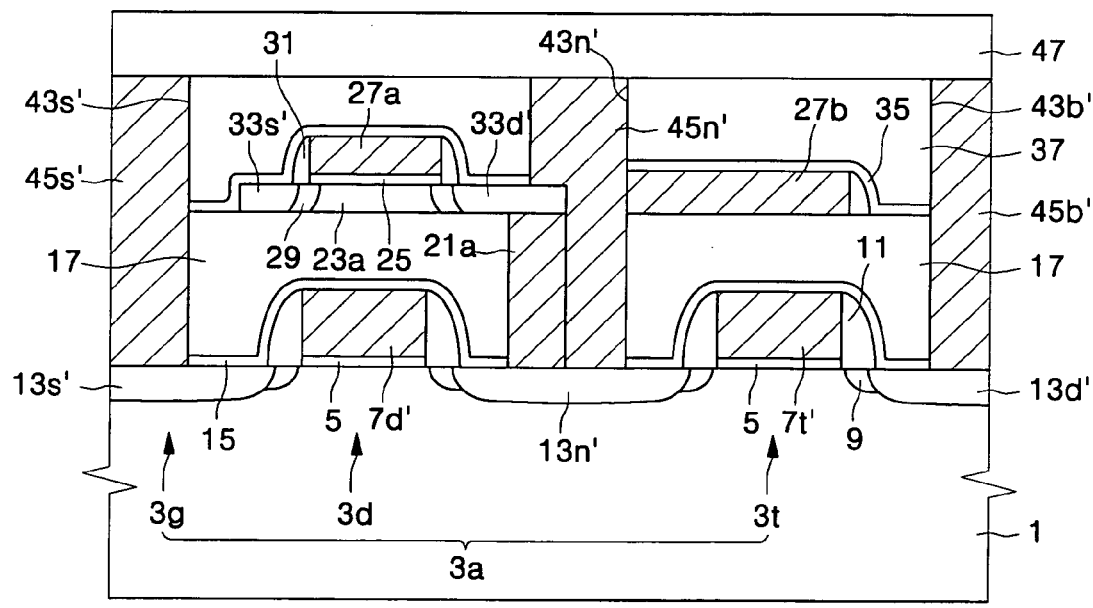
Figure 13C:
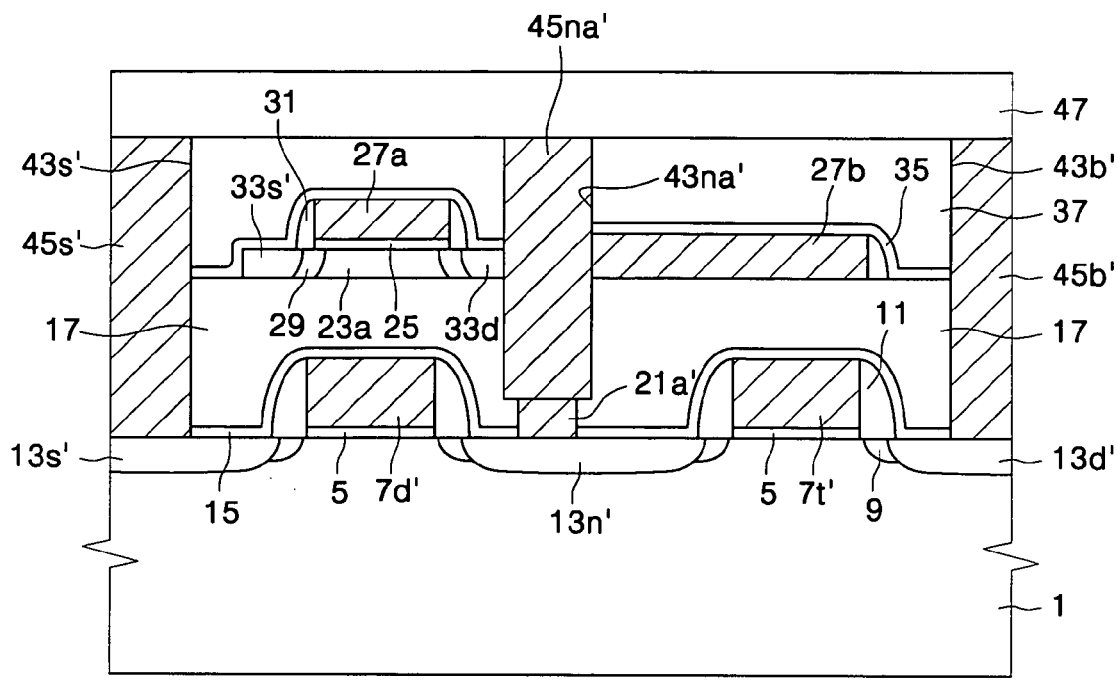
FIGS. 13C and 13D are cross-sectional views illustrating drain node contact structures of CMOS SRAM cells according to further embodiments of the present invention.
Figure 13D:
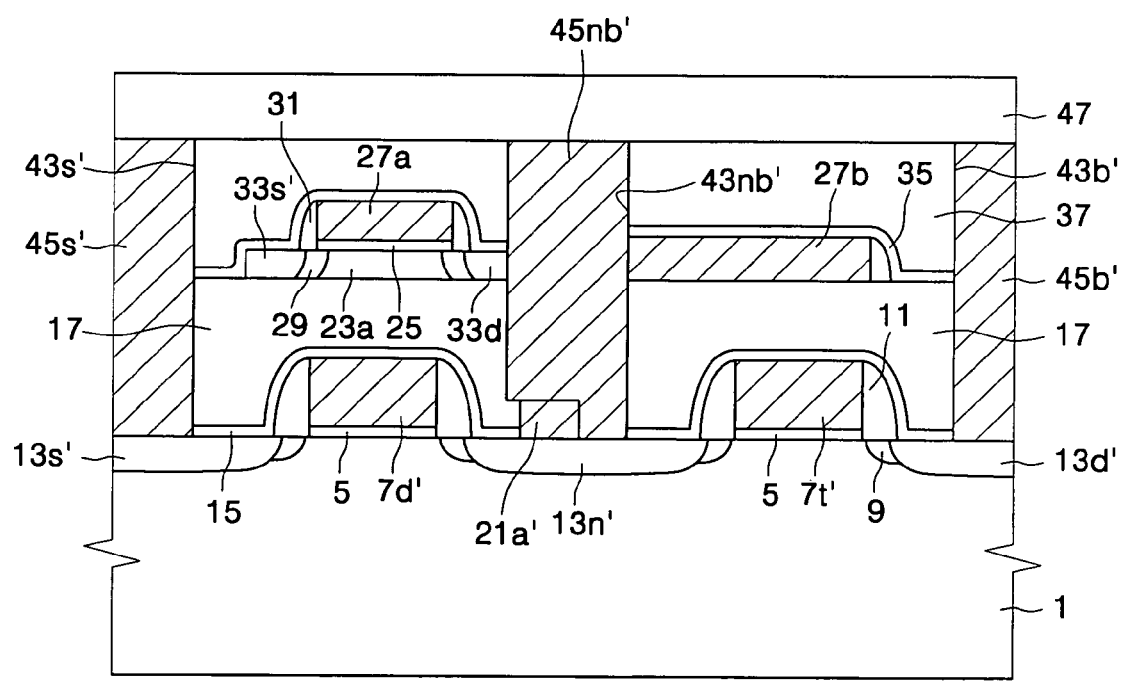

FIGS. 13C and 13D are cross-sectional views illustrating first drain node contact structures of SRAM cells according to other embodiments of the present invention.

Referring now to FIG. 13C, a first metal drain plug 45na' is disposed to pass through the upper interlayer insulating layer 37, the upper etch stop layer 35, the second load gate electrode 27b, the first drain region 33d' and the lower interlayer insulating layer 17. Thus, the first metal drain plug 45na' is electrically connected to the first drain region 33d' and the second load gate electrode 27b. The first metal drain plug 45na' may have a bottom surface that is higher than a top surface of the first node impurity region 13n'. A first node semiconductor plug 21a' is interposed between the first metal drain plug 45na' and the first node impurity region 13n'. As such, the first metal drain plug 45na' is electrically connected to the first node impurity region 13n' through the first node semiconductor plug 21a'. In other words, the first metal drain plug 45na' is directly on the first node impurity region 13n' and the semiconductor plug 21a'. In such a case, the first node semiconductor plug 21a' may have the same conductivity type as the first node impurity region 13n'.

A second drain node contact structure formed on the second node impurity region may also have the same configuration as the first drain node contact structure shown in F13C.

Referring now to FIG. 13D, a first metal drain plug 45nb' is disposed to pass through the upper interlayer insulating layer 37, the upper etch stop layer 35, the second load gate electrode 27b, the first drain region 33d' and the lower interlayer insulating layer 17. The first node semiconductor plug 21a' is interposed between the first metal drain plug 45nb' and the first node impurity region 13n'. In addition, a portion of the first metal drain plug 45nb' is extended to be in direct contact with the first node impurity region 13n'. In other words, the first metal drain plug 45nb' is directly on the first node impurity region 13n' and at least one sidewall of the semiconductor plug 21a'. Therefore, even if the first node semiconductor plug 21a' is a different conductivity type than the first node impurity region 13n' or an intrinsic semiconductor, the contact resistance between the first drain region 33d', the second load gate electrode 27b, and the first node impurity region 13n' may be reduced.

A second drain node contact structure formed on the second node impurity region may also have the same configuration as the first drain node contact structure shown in FIG. 13D.

Methods of fabricating SRAM cells according to some embodiments of the present invention will now be described with reference to FIGS. 2 to 9, 10A to 17A, 10B to 17B, 13C and 13D. FIGS. 10A to 17A are cross-sectional views taken along line I-I' of FIGS. 2 to 9, respectively. FIGS. 10B to 17B are cross-sectional views taken along line II-II' of FIGS. 2 to 9, respectively. Further, FIGS. 13C and 13D are cross-sectional views illustrating methods of fabricating drain node contact structures according to further embodiments of the present invention.

Figure 10A:
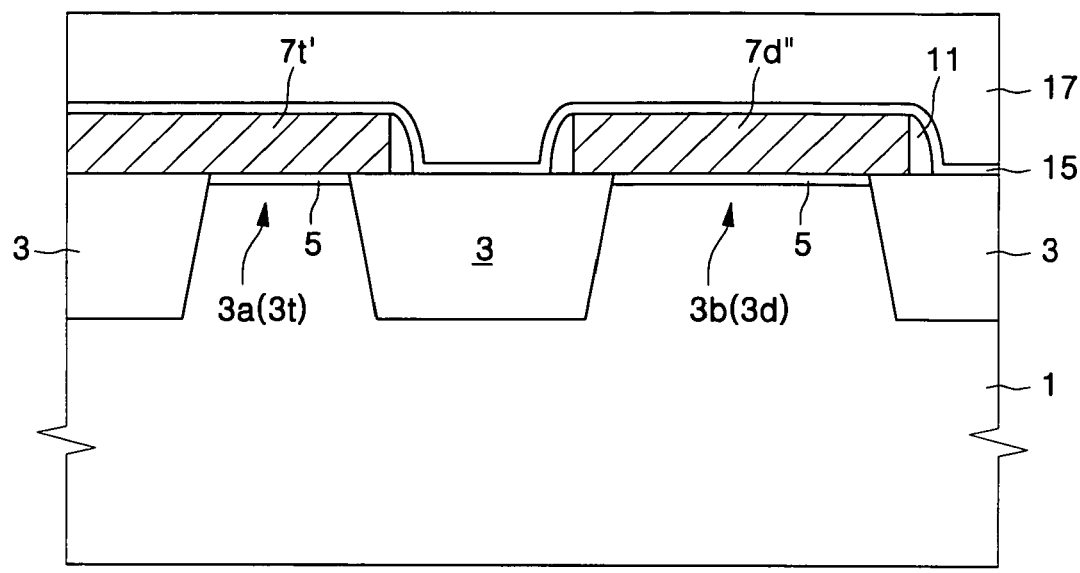
FIGS. 10A, 11A, 12A, 13A, 14A, 15A, 16A and 17A are cross-sectional views taken along line I-I' of FIGS. 2 to 9, respectively, illustrating methods of fabricating CMOS SRAM cells according to some embodiments of the present invention.
Figure 10B:
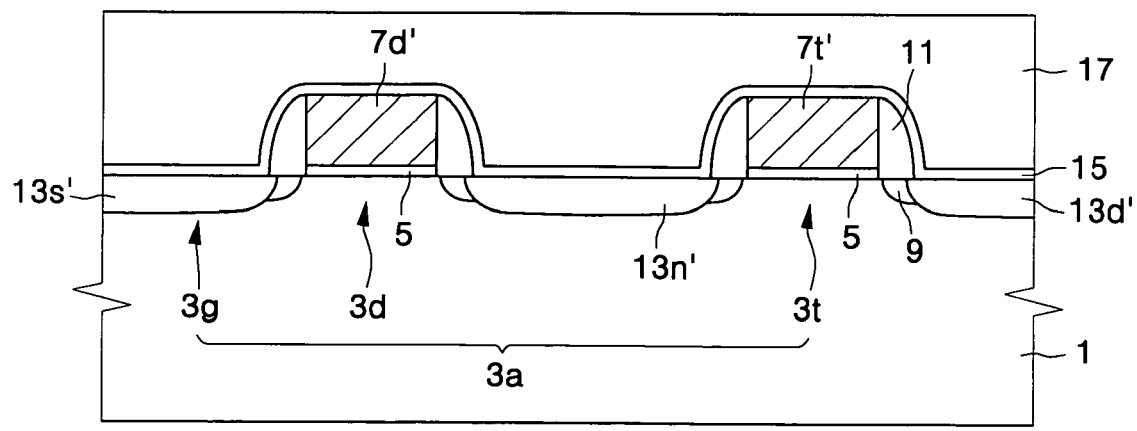
FIGS. 10B, 11B, 12B, 13B, 14B, 15B, 16B and 17B are cross-sectional views taken along line II-II' of FIGS. 2 to 9, respectively, illustrating methods of fabricating CMOS SRAM cells according to some embodiments of the present invention.

Referring to FIGS. 2, 10A and 10B, an isolation layer 3 is formed on a predetermined region of a semiconductor substrate 1, such as a single crystalline silicon substrate to define first and second active regions 3a and 3b that are parallel to a y-axis. Each of the first and second active regions 3a and 3b may be defined to include a transfer transistor active region 3t and a driver transistor active region 3d having a width greater than that of the transfer transistor active region 3t. In addition, each of the first and second active regions 3a and 3b may be defined to include a ground active region 3g extended from an end portion of the driver transistor active region 3d toward a neighboring cell region along an x-axis. The driver and transfer transistor active regions 3d and 3t of the first active region 3a are defined to be adjacent to the transfer and driver transistor active regions 3t and 3d of the second active region 3b, respectively.

A gate insulating layer 5 is formed on the active regions 3a and 3b. A gate conductive layer such as an N-type polycrystalline silicon layer is formed on a top surface of the semiconductor substrate including the gate insulating layer 5. The gate conductive layer is patterned to form a first driver gate electrode 7d' and a first transfer gate electrode 7t' crossing over the first active region 3a, as well as a second driver gate electrode 7d" and a second transfer gate electrode 7t" crossing over the second active region 3b. The first transfer gate electrode 7t' and the first driver gate electrode 7d' are formed to cross over the transfer and driver transistor active regions 3t and 3d of the first active region 3a, respectively, and the second transfer gate electrode 7t" and the second driver gate electrode 7d" are formed to cross over the transfer and driver transistor active regions 3t and 3d of the second active region 3b, respectively.

Impurity ions of a first conductivity type are implanted into the active regions 3a and 3b using the transfer gate electrodes 7t' and 7t" and the driver gate electrodes 7d' and 7d" as ion implantation masks, thereby forming lightly doped drain (LDD) regions 9. The impurity ions of the first conductivity type may be N-type impurity ions. Gate spacers 11 are formed on sidewalls of the transfer gate electrodes 7t' and 7t" and the driver gate electrodes 7d' and 7d". Impurity ions of the first conductivity type are implanted into the active regions 3a and 3b using the gate electrodes 7t', 7t", 7d' and 7d" and the gate spacers 11 as ion implantation masks. As a result, a first node impurity region 13n' is formed in the first active region 3a between the first driver gate electrode 7d' and the first transfer gate electrode 7t'. A first bit line impurity region 13d' is also formed in the first active region 3a adjacent to the first transfer gate electrode 7t' and opposite to the first node impurity region 13n', and a first ground impurity region 13s' is formed in the first active region 3a adjacent to the first driver gate electrode 7d' and opposite to the first node impurity region 13n'. In addition, a second node impurity region (not shown) is formed in the second active region 3b between the second driver gate electrode 7d" and the second transfer gate electrode 7t". A second bit line impurity region (not shown) is similarly formed in the second active region 3b which is adjacent to the second transfer gate electrode 7t" and opposite to the second node impurity region, and a second ground impurity region (not shown) is formed in the second active region 3b adjacent to the second driver gate electrode 7d" and opposite to the second node impurity region. The LDD regions 9 remain under the gate spacers 11. The impurity regions 13s', 13n' and 13d' are formed to have an impurity concentration higher than that of the LDD regions 9. Accordingly, the impurity regions form source/drain regions having a lightly doped drain (LDD) structure in the active regions 3a and 3b. As such, first and second driver transistors are formed between the impurity regions 13s', 13n' and 13d' on the surface of the substrate. The first and second driver transistors may be N-channel bulk MOS transistors.

A lower interlayer insulating layer 17 is then formed on the semiconductor substrate including the impurity regions 13s', 13n' and 13d'. A lower etch stop layer 15 may be conformably formed on the substrate prior to forming the lower interlayer insulating layer 17. The lower etch stop layer 15 may be formed of an insulating layer having an etch selectivity with respect to the lower interlayer insulating layer 17.

Figure 11A:
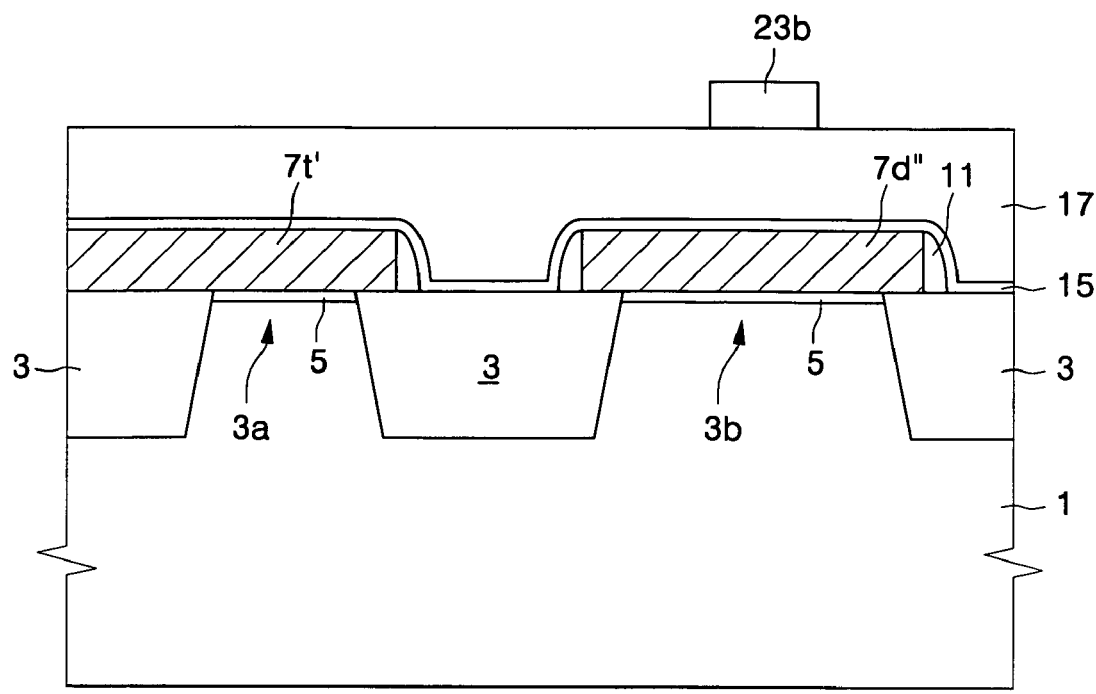
Figure 11B:
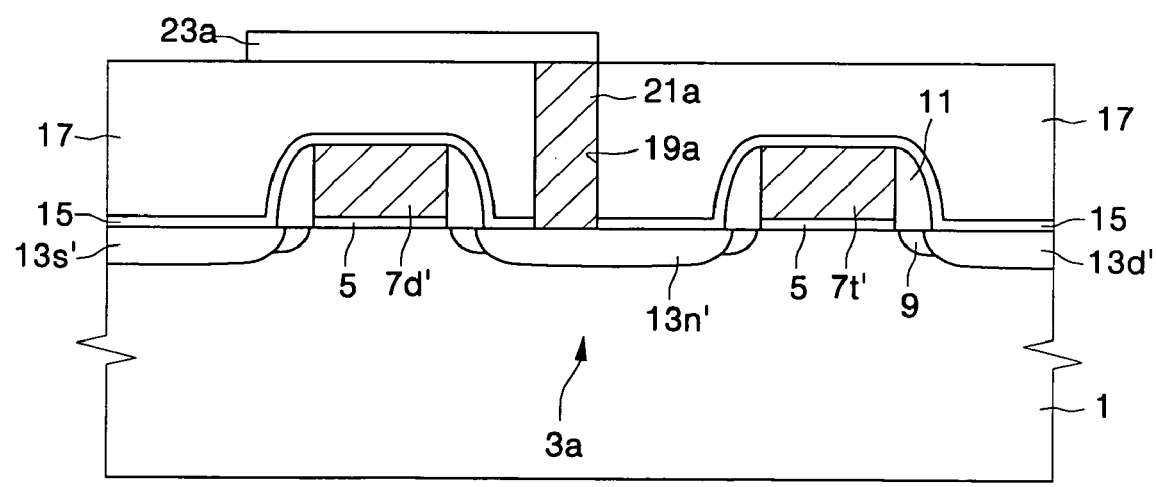

Referring now to FIGS. 3, 11A and 11B, the lower interlayer insulating layer 17 and the lower etch stop layer 15 are patterned to form first and second node contact holes 19a and 19b which expose the first and second node impurity regions, respectively. A first node semiconductor plug 21a and a second node semiconductor plug (not shown) are formed in the first and second node contact holes 19a and 19b, respectively. Accordingly, the first node semiconductor plug 21a is directly on a first source/drain region, and the second node semiconductor plug is directly on a second source/drain region. The node semiconductor plugs may be formed using a selective epitaxial growth (SEG) technique. In particular, the node semiconductor plugs may be grown to have the same crystalline phase as the exposed node impurity regions. For example, when the semiconductor substrate 1 is a single crystalline silicon substrate and the SEG technique is carried out using a silicon source gas, the node semiconductor plugs may be formed to have a single crystalline silicon structure. The node semiconductor plugs may be doped with P-type or N-type impurities. Alternatively, the node semiconductor plugs may be formed of an intrinsic semiconductor.

A semiconductor body layer is formed on the semiconductor substrate including the node semiconductor plugs. The semiconductor body layer may be formed of an amorphous silicon layer or a polycrystalline silicon layer. The semiconductor body layer is patterned to form first and second body patterns 23a and 23b on the lower interlayer insulating layer 17. The first body pattern 23a is formed to cross over the first driver gate electrode 7d' and to be in contact with the first node semiconductor plug 21a, and the second body pattern 23b is formed to cross over the second driver gate electrode 7d" and to be in contact with the second node semiconductor plug.

The first and second body patterns 23a and 23b are then crystallized to form a single crystalline structure. The crystallization of the body patterns 23a and 23b may be performed using a solid phase epitaxial (SPE) technique that is well known in the art. The SPE technique may be performed at a temperature of about 500° C. to about 800° C.

The node semiconductor plugs serve as seed layers during the SPE process. In other words, the body patterns 23a and 23b are converted to have the same crystalline structure as the node semiconductor plugs. For example, when the node semiconductor plugs are single crystalline silicon plugs and the body patterns 23a and 23b are either amorphous silicon patterns or polycrystalline silicon patterns, the body patterns 23a and 23b may be converted into single crystalline silicon patterns during the SPE process.

The body patterns 23a and 23b may be crystallized before the semiconductor body layer is patterned. However, when crystallization is performed before the semiconductor body layer is patterned, grain boundaries may be formed in channel regions of load transistors that will to be formed in subsequent processes. As such, electrical characteristics of the load transistors may be degraded, and the load transistors may exhibit non-uniform electrical characteristics due to the grain boundaries. Therefore, crystallization may be performed after the semiconductor body layer is patterned.

Figure 12A:
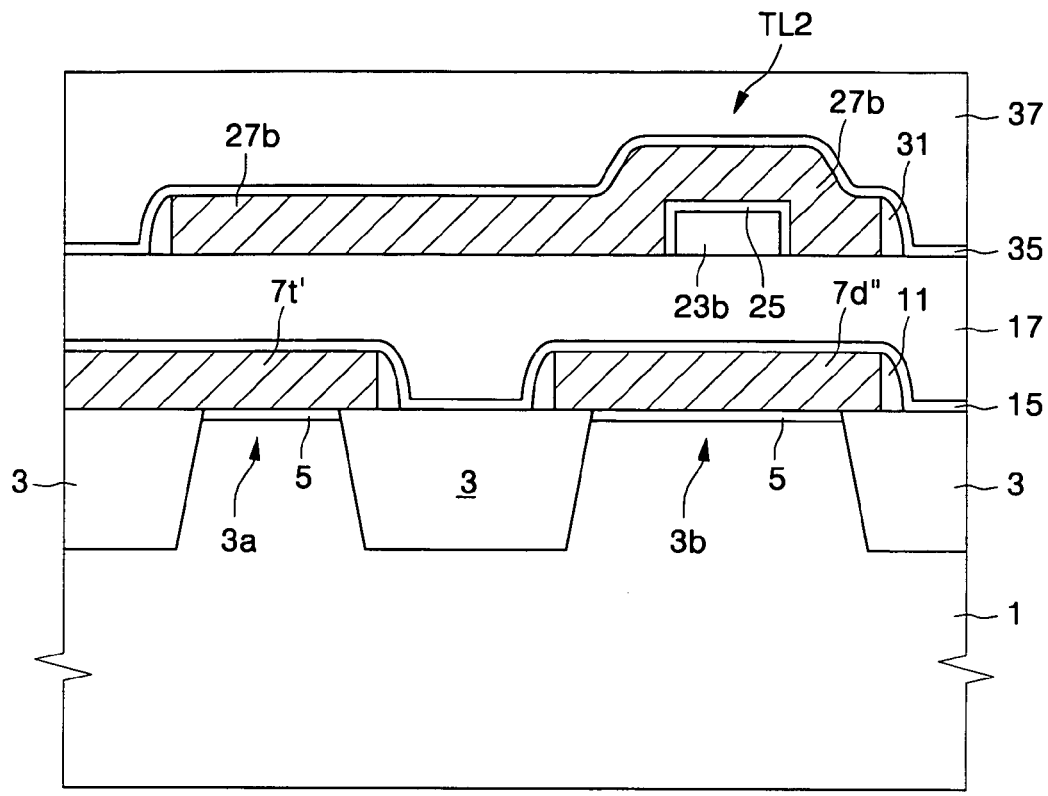
Figure 12B:
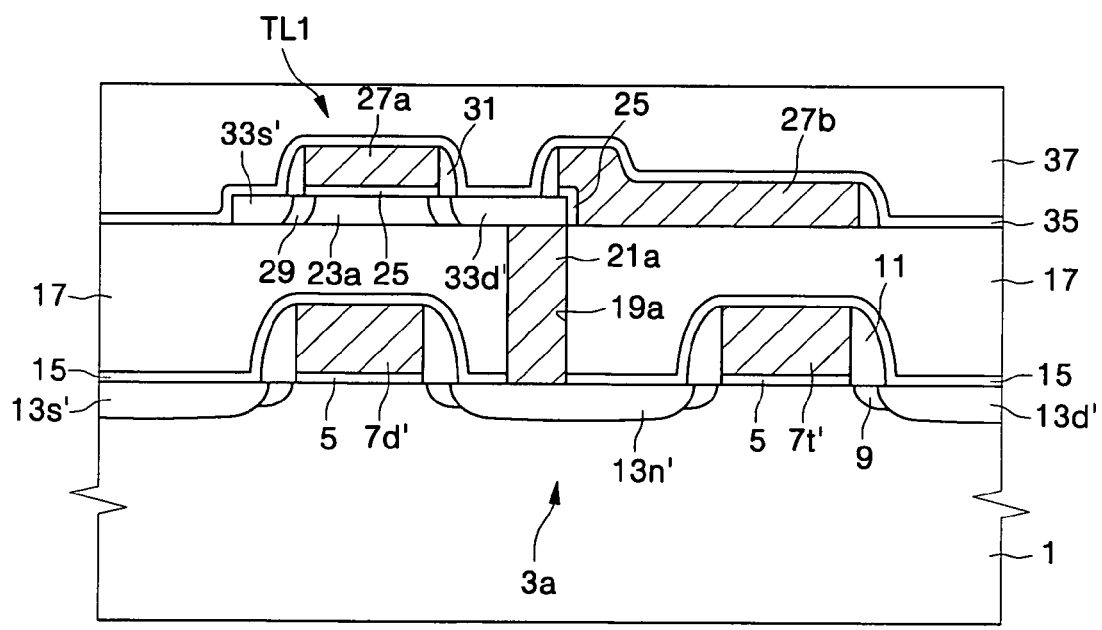

Referring now to FIGS. 4, 12A and 12B, a gate insulating layer 25 is formed on surfaces of the crystallized body patterns. A gate conductive layer is then formed on the gate insulating layer 25. The gate conductive layer may be formed of a polycrystalline silicon layer. The gate conductive layer is patterned to form first and second load gate electrodes 27a and 27b crossing over the first and second body patterns 23a and 23b, respectively. The first load gate electrode 27a is formed so that one end of the first load gate electrode 27a overlaps with and/or is adjacent the second body pattern 23b on the second node semiconductor plug. Similarly, the second load gate electrode 27b is formed so that one end of the second load gate electrode 27b overlaps with and/or is adjacent to the first body pattern 23a on the first node semiconductor plug 21a.

Impurity ions of a second conductivity type different from the first conductivity type, are implanted into the body patterns 23a and 23b using the load gate electrodes 27a and 27b as ion implantation masks, thereby forming LDD regions 29 of the second conductivity type. Gate spacers 31 are then formed on sidewalls of the load gate electrodes 27a and 27b. Impurity ions of the second conductivity type are then implanted into the body patterns 23a and 23b using the load gate electrodes 27a and 27b and the gate spacers 31 as ion implantation masks. As a result, a first drain region 33d' is formed in the first body pattern 23a adjacent to the first load gate electrode 27a and in contact with the first semiconductor plug 21a, and a second drain region (not shown) is formed in the second body pattern 23b adjacent to the second load gate electrode 27b and in contact with the second semiconductor plug. Further, a first source region 33s' is formed in the first body pattern 23a adjacent to the first load gate electrode 27a and opposite to the first drain region 33d', and a second source region (not shown) is formed in the second body pattern 23b adjacent to the second load gate electrode 27b and opposite to the second drain region. As such, first and second load transistors TL1 and TL2 are formed at the first and second body patterns 23a and 23b, respectively. When the second conductivity type is P-type, the load transistors TL1 and TL2 may be P-channel TFTs, and the load gate electrodes 27a and 27b may be P-type polycrystalline silicon patterns.

An upper interlayer insulating layer 37 is formed on the semiconductor substrate including the load transistors TL1 and TL2. A conformable upper etch stop layer 35 may also be formed prior to forming the upper interlayer insulating layer 37. The upper etch stop layer 35 may be formed of an insulating layer having an etch selectivity with respect to the upper interlayer insulating layer 37. For example, when the upper interlayer insulating layer 37 is formed of a silicon oxide layer, the upper etch stop layer 35 may be formed of a silicon oxynitride layer or a silicon nitride layer.

Referring now to FIGS. 5, 13A and 13B, the upper interlayer insulating layer 37, the upper etch stop layer 35, the load gate electrodes 27a and 27b, the lower interlayer insulating layer 17, and the lower etch stop layer 15 are successively patterned to form first and second gate contact holes 39a and 39b that expose the first and second driver gate electrodes 7d' and 7d," respectively. A first metal gate plug (not shown) is formed in the first gate contact hole 39a, and a second metal gate plug 41b is formed in the second gate contact hole 39b.

The upper interlayer insulating layer 37, the upper etch stop layer 35, the load gate electrodes 27a and 27b, the lower interlayer insulating layer 17 and the lower etch stop layer 15 are patterned to form first and second drain contact holes 43n' and 43n". The first drain contact hole 43n' is formed to expose the first drain region 33d', a sidewall of the first node semiconductor plug 21a, the second load gate electrode 27b, and the first node impurity region 13n'. The second drain contact hole 43n" is formed to expose the second drain region, a sidewall of the second node semiconductor plug, the first load gate electrode 27a, and the second node impurity region. During formation of the drain contact holes 43n' and 43n", first and second lower bit line contact holes 43b' and 43b" (which expose the first and second bit line impurity regions, respectively) as well as first and second lower ground line contact holes 43s' and 43s'" (which expose the first and second ground impurity regions, respectively) may be formed.

A first metal drain plug 45n' is formed in the first drain contact hole 43n', and a second metal drain plug (not shown) is formed in the second drain contact hole 43n". Accordingly, the first metal drain plug 45n' is directly on the first drain region 33d', a sidewall of the first node semiconductor plug 21a, and the second load gate electrode 27b, and the second metal drain plug is directly on the second drain region, a sidewall of the second node semiconductor plug, and the first load gate electrode. Further, a first lower ground line contact plug 45s' is formed in the first lower ground line contact hole 43s', and a second lower ground line contact plug (not shown) is formed in the second lower ground line contact hole 43s'". In addition, a first lower bit line contact plug 45b' is formed in the first lower bit line contact hole 43b', and a second lower bit line contact plug (not shown) is formed in the second lower bit line contact hole 43b".

The first and second drain contact holes 43n' and 43n", the first and second lower ground line contact holes 43s' and 43s'", and the first and second lower bit line contact holes 43b' and 43b" may be formed simultaneously together with the first and second gate contact holes 39a and 39b. In such a case, the metal drain plugs, the lower bit line contact plugs and the lower ground line contact plugs are also formed simultaneously with the metal gate plugs. The metal drain plugs, the lower bit line contact plugs, the lower ground line contact plugs and the metal gate plugs may be formed of a metal layer chosen to provide an ohmic contact with respect to P-type and N-type semiconductors. More particularly, the plugs may be formed by sequentially stacking a barrier metal layer, such as a titanium nitride layer, and a metal layer, such as a tungsten layer, and by planarizing the metal layer and the barrier metal layer. As a result, each of the plugs may include a tungsten plug and a barrier metal layer pattern surrounding the tungsten plug. Alternatively, the plugs may be formed of a single metal layer, such as a tungsten layer.

A first insulating layer 47 is then formed on the semiconductor substrate including the metal drain plugs, the lower bit line contact plugs, the lower ground line contact plugs, and the metal gate plugs.

As such, the semiconductor plugs and the metal drain plugs respectively form multi-layer plugs between the source/drain regions of the driver transistors and the source/drain regions of the load transistors. In some embodiments, the metal drain plugs may be formed in a different configuration then that described with reference to FIG. 13B. FIGS. 13C and 13D are cross-sectional views illustrating methods of forming metal drain plugs of SRAM cells according to further embodiments of the present invention.

Referring to FIG. 13C, the upper interlayer insulating layer 37, the upper etch stop layer 35, the second load gate electrode 27b, the first drain region 33d and the first node semiconductor plug 21a are etched to form a first drain contact hole 43na'. The first drain contact hole 43na' may be formed such that the first node impurity region 13n' is not exposed. Thus, after the first drain contact hole 43na' is formed, a first recessed node semiconductor plug 21a' remains on the first node impurity region 13n'. Then, a first metal drain plug 45na' is formed in the first drain contact hole 43na' using a metal layer, such as a tungsten layer. As such, the first metal drain plug 45na' is formed directly on the first semiconductor plug 21a' and the first drain region 33d. A second metal drain plug (not shown) having the same configuration as the first metal drain plug 45na' is formed on the second node impurity region during formation of the first metal drain plug 45na'.

The first metal drain plug 45na' shown in FIG. 13C may be formed when the node semiconductor plugs have the same conductivity type as the node impurity regions.

Referring now to FIG. 13D, after forming the first drain contact hole 43na' described in FIG. 13C, the lower interlayer insulating layer 17 and the lower etch stop layer 15 are also etched. As a result, a first drain contact hole 43nb' is formed to expose the first node impurity region 13n' as well as the first recessed node semiconductor plug 21a'. A first metal drain plug 45nb' is formed in the first drain contact hole 43nb' using a metal layer such as a tungsten layer. As such, the first metal drain plug 45nb' is formed directly on the first node impurity region 13n' and at least one sidewall of the first semiconductor plug 21a'. Thus, even if the first node semiconductor plug 21a' is formed of a semiconductor material having a different conductivity type than the first node impurity region 13n' or an intrinsic semiconductor material, the contact resistance between the first drain region 33d', the second load gate electrode 27b, and the first node impurity region 13n' may be reduced. A second metal drain plug (not shown) having the same configuration as the first metal drain plug 45nb' is formed on the second node impurity region during formation of the first metal drain plug 45nb'.

Figure 14A:
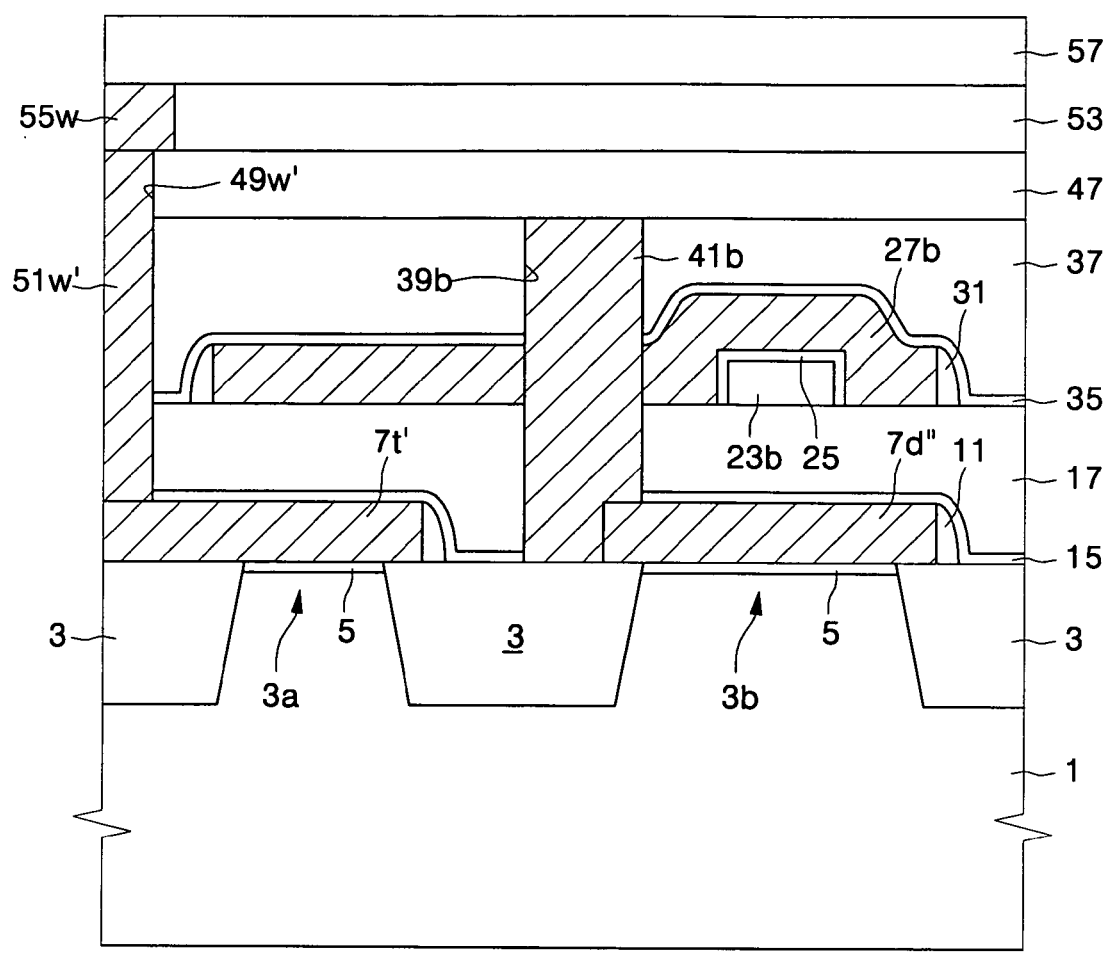
Figure 14B:
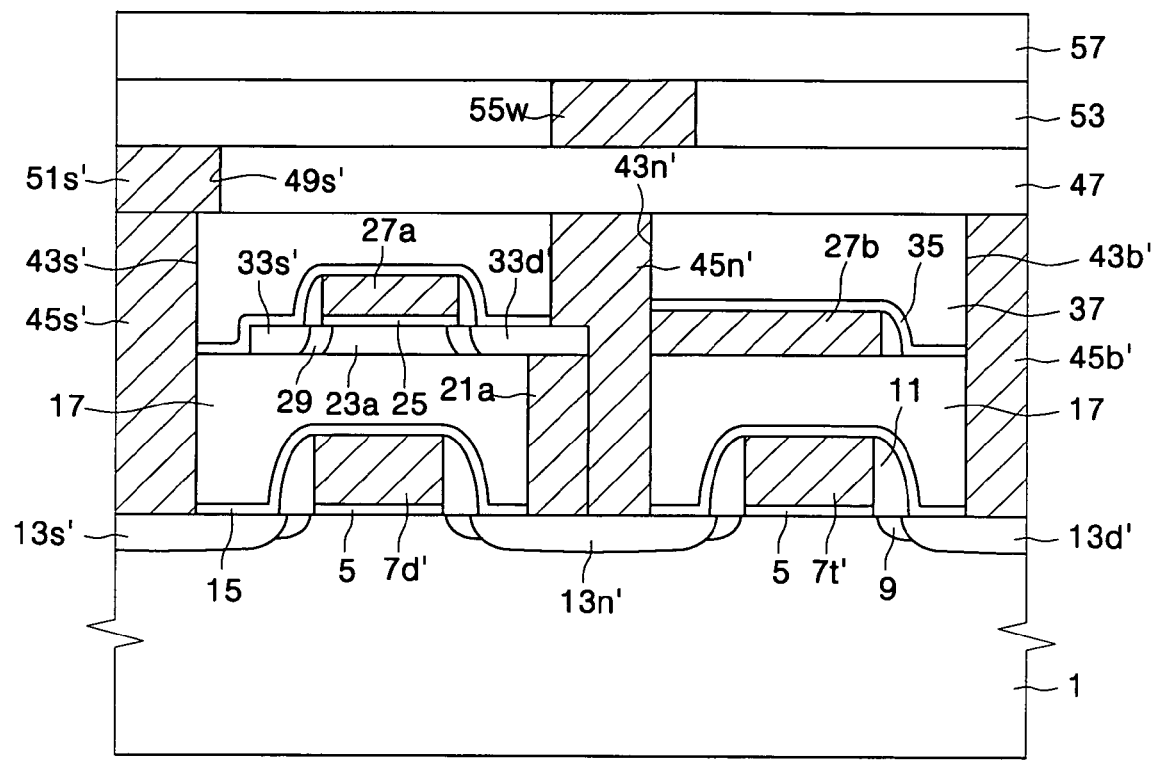

Referring now to FIGS. 6, 14A and 14B, the first insulating layer 47, the upper interlayer insulating layer 37, the upper etch stop layer 35, the lower interlayer insulating layer 17, and the lower etch stop layer 15 are patterned to form first and second word line contact holes 49w' and 49w''' which expose the first and second transfer gate electrodes 7t' and 7t,'' respectively. During formation of the word line contact holes 49w' and 49w', first and second intermediate ground line contact holes 49s' and 49s''' are formed to expose the first lower ground line contact plug 45s' and the second lower ground line contact plug, respectively. A first word line contact plug 51w' and a second word line contact plug (not shown) are formed in the first and second word line contact holes 49w' and 49w''', respectively, and a first intermediate ground line contact plug 51s' and a second intermediate ground line contact plug (not shown) are formed in the first and second intermediate ground line contact holes 49s' and 49s''', respectively.

A second insulating layer 53 is then formed on the semiconductor substrate including the word line contact plugs and the intermediate ground line contact plugs. Word lines 55w, which are parallel to the x-axis, are then formed in the second insulating layer 53 using a damascene process. The word lines 55w are formed to be in contact with the word line contact plugs. A third insulating layer 57 is formed on the semiconductor substrate including the word lines 55w.

Figure 15A:
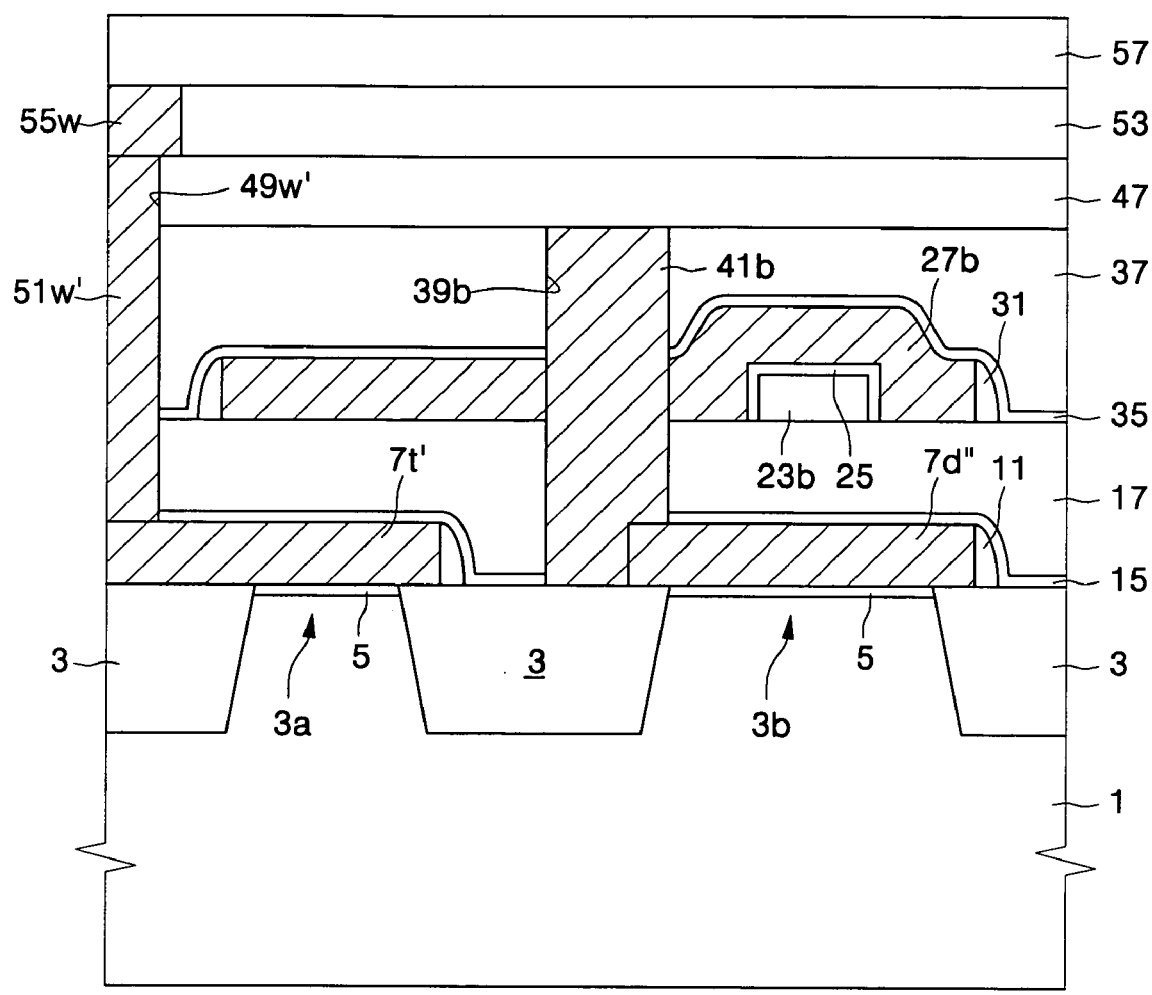
Figure 15B:
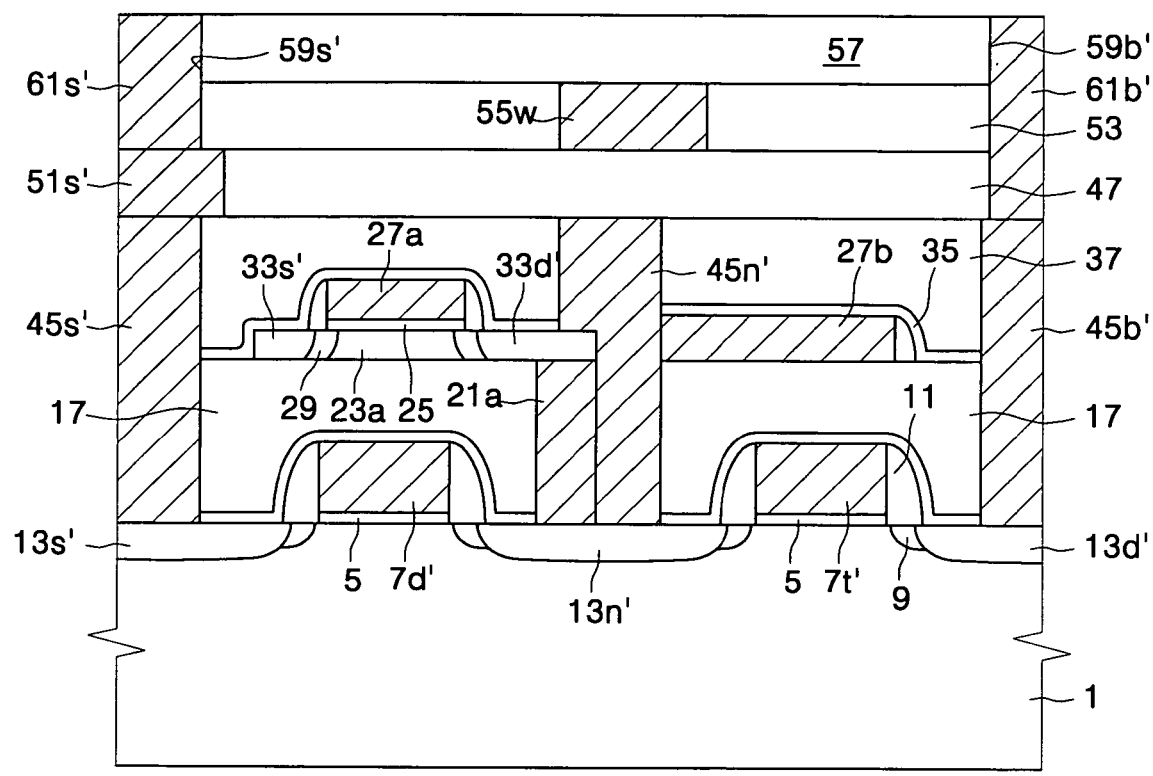

Referring to FIGS. 7, 15A and 15B, the first to third insulating layers 47, 53 and 57, the upper interlayer insulating layer 37, and the upper etch stop layer 35 are patterned to form first and second power line contact holes 59c' and 59c''' which expose the first source region 33s' and the second source region (not shown), respectively. During formation of the power line contact holes 59c' and 59c''', first and second upper ground line contact holes 59s' and 59s''' are formed to expose the first and second intermediate ground line contact plugs, respectively, and first and second intermediate bit line contact holes 59b' and 59b''' are formed to expose the first and second lower bit line contact plugs, respectively. First and second power line contact plugs (not shown) are formed in the first and second power line contact holes 59c' and 59c''', respectively, and first upper ground line contact plug 61s' and second upper ground line contact plug (not shown) are formed in the first and second upper ground line contact holes 59s' and 59s''', respectively. A first intermediate bit line contact plug 61b' and a second intermediate bit line contact plug (not shown) are respectively formed in the first and second intermediate bit line contact holes 59b' and 59b''' during formation of the power line contact plugs and the upper ground line contact plugs.

Figure 16A:
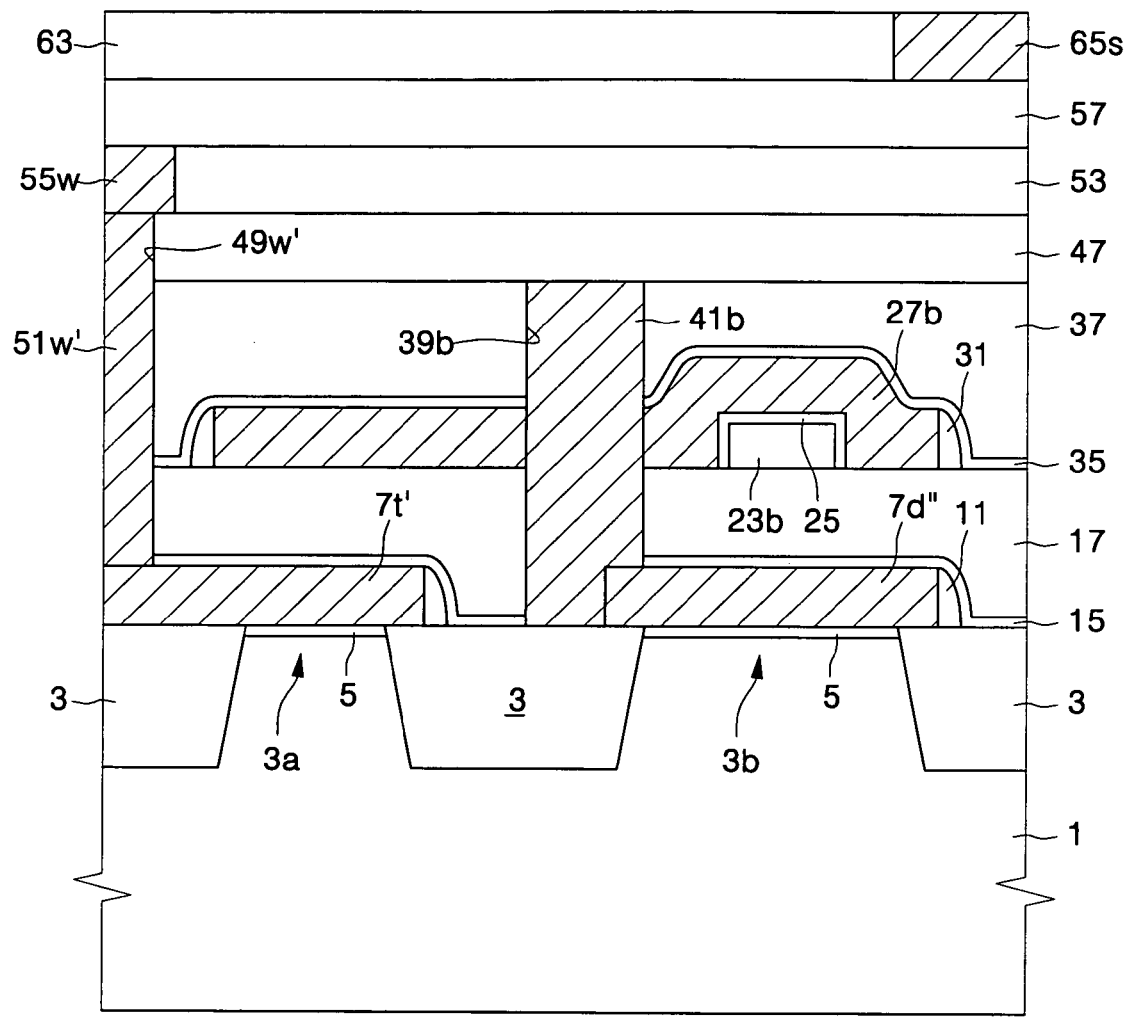
Figure 16B:
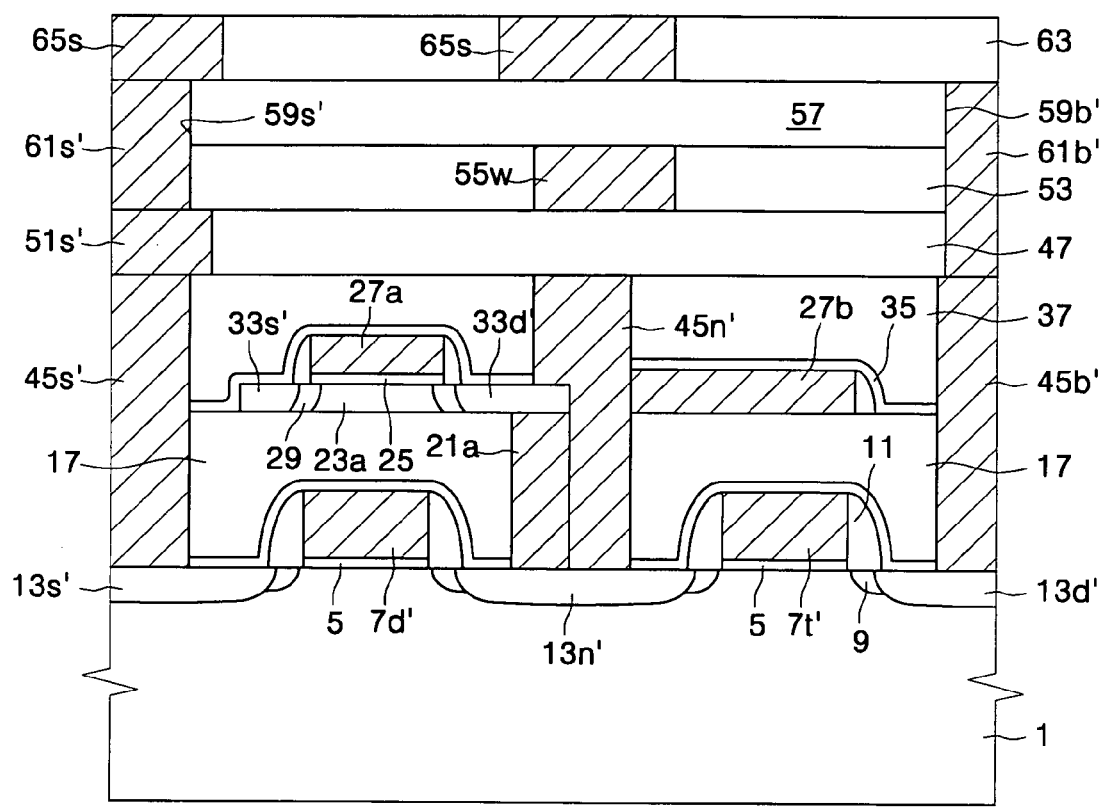

Referring now to FIGS. 8, 16A and 16B, a fourth insulating layer 63 is formed on the semiconductor substrate including the power line contact plugs. A ground line 65s and a power line 65c are formed in the fourth insulating layer 63 using a damascene process. The ground line 65s and the power line 65c is formed to cross over the active regions 3a and 3b. The ground line 65s are formed to be in contact with the first and second upper ground line contact plugs, and the power line 65c is formed to be in contact with the first and second power line contact plugs.

Referring to FIGS. 9, 17A and 17B, a fifth insulating layer 67 is formed on the semiconductor substrate including the power and ground lines 65c and 65s. The fifth insulating layer 67 is patterned to form first and second upper bit line contact holes 69b' and 69b''' which expose the first and second intermediate bit line contact plugs respectively. A first upper bit line contact plug 71b' and a second upper bit line contact plug (not shown) are formed in the first and second upper bit line contact holes 69b' and 69b''', respectively. A conductive layer such as a metal layer is formed on the semiconductor substrate including the upper bit line contact plugs. The conductive layer is patterned to from first and second bit lines 73b' and 73b''' which are parallel to each other. The first bit line 73b' is formed to cover the first upper bit line contact plug 71b', and the second bit line 73b''' is formed to cover the second upper bit line contact plug.

Accordingly, a static random-access memory (SRAM) device includes a bulk MOS transistor on a semiconductor substrate having a source/drain region therein, an insulating layer on the bulk MOS transistor, and a thin-film transistor having a source/drain region therein on the insulating layer above the bulk MOS transistor. A multi-layer plug electrically connects the source/drain region of the bulk MOS transistor to the source/drain region of the thin-film transistor. The multi-layer plug includes a semiconductor plug extending through at least a portion of the insulating layer and directly on the source/drain region of the bulk MOS transistor, and a metal plug extending through at least a portion of the insulating layer and directly on the source/drain region of the thin-film transistor and the semiconductor plug.

As set forth above, according to embodiments of the present invention, thin film MOS transistors are formed having single crystalline body patterns, and drain node contact structures providing ohmic contact are formed on node impurity regions. Accordingly, if the drain node contact structures and the thin film MOS transistors are used in SRAM cells, it may be possible to form compact cells suitable for highly integrated SRAM devices with the electrical characteristics comparable to bulk CMOS SRAM cells.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. An interconnection structure in a semiconductor device, comprising:
  an insulating layer including a contact hole extending therethrough on an active region of a semiconductor substrate;
  a conductive layer pattern on the insulating layer; and a multi-layer plug vertically extending completely through the contact hole in the insulating layer to electrically connect the conductive layer pattern and the active region, the multi-layer plug comprising a semiconductor plug directly on the active region and extending through at least a portion of the insulating layer, and a metal plug directly on the semiconductor plug and the conductive layer pattern and extending through at least a portion of the insulating layer, wherein the metal plug is directly on the active region and at least one sidewall of the semiconductor plug, and wherein the multi-layer plug does not extend directly on the insulating layer outside the contact hole.

2. The interconnection structure of claim 1, wherein the semiconductor plug and the active region comprise a same conductivity type, and wherein the active region and the conductive layer pattern comprise different conductivity types.

3. The interconnection structure of claim 2, wherein the semiconductor plug and the active region comprise an n-type conductivity, and wherein at least a portion of the conductive layer pattern comprises a p-type conductivity.

4. The interconnection structure of claim 1, wherein the semiconductor plug comprises an intrinsic semiconductor and/or a different conductivity type than the active region.

5. The interconnection structure of claim 4, wherein the semiconductor plug comprises a p-type conductivity, and wherein the active region comprises an n-type conductivity.

6. The interconnection structure of claim 1, wherein the semiconductor plug is directly on the conductive layer pattern.

7. The interconnection structure of claim 6, wherein the semiconductor plug is directly on a bottom surface of the conductive layer pattern, and wherein the metal plug is directly on a sidewall of the semiconductor plug and an end portion of the conductive layer pattern.

8. The interconnection structure of claim 1, wherein the metal plug passes through a portion of the conductive layer pattern, and the semiconductor plug extends between the metal plug and the active region.

9. The interconnection structure of claim 1, wherein the conductive layer pattern is a first conductive layer pattern, and further comprising:
a second conductive layer pattern on the insulating layer adjacent the first conductive layer pattern and directly on the metal plug.

10. The interconnection structure of claim 1, wherein the conductive layer pattern and the semiconductor plug comprise single crystalline silicon.

11. The interconnection structure of claim 1, wherein the metal plug is a metal layer having ohmic contact with both an n-type semiconductor and a p-type semiconductor.

12. The interconnection structure of claim 1, wherein the active region comprises a source/drain region of a bulk MOS transistor, and wherein the conductive layer pattern comprises a source/drain region of a thin-film transistor.

13. The interconnection structure of claim 1, wherein the contact hole in the insulating layer is free of oblique sidewalls.

14. The interconnection structure of claim 13, wherein the multi-layer plug is horizontally confined within a perimeter defined by the contact hole.

15. The interconnection structure of claim 1, wherein the multi-layer plug is horizontally confined within a perimeter defined by the contact hole.

16. A static random-access memory (SRAM) device, comprising:
a bulk MOS transistor on a semiconductor substrate having a source/drain region therein;
an insulating layer including a contact hole extending therethrough on the bulk MOS transistor, wherein the insulating layer covers the bulk MOS transistor;
a thin-film transistor having a source/drain region therein on the insulating layer above the bulk MOS transistor; and
a multi-layer plug vertically extending completely through the contact hole in the insulating layer to electrically connect the source/drain region of the thin-film transistor and the source/drain region of the bulk MOS transistor, the multi-layer plug comprising a semiconductor plug extending through at least a portion of the insulating layer and directly on the source/drain region of the bulk MOS transistor, and a metal plug extending through at least a portion of the insulating layer and directly on the source/drain region of the thin-film transistor and the semiconductor plug, wherein the multi-layer plug does not extend directly on the insulating layer outside the contact hole.

17. The device of claim 16, wherein the semiconductor plug and the source/drain region of the bulk MOS transistor comprise a same conductivity type, and wherein the source/drain region of the bulk MOS transistor and the source/drain region of the thin-film transistor comprise different conductivity types.

18. The device of claim 17, wherein the semiconductor plug and the source/drain region of the bulk MOS transistor comprise an n-type conductivity, and wherein the source drain region of the thin-film transistor comprises a p-type conductivity.

19. The device of claim 16, wherein the metal plug is directly on the source/drain region of the bulk MOS transistor and at least one outer sidewall of the semiconductor plug.

20. The device of claim 19, wherein the semiconductor plug comprises an intrinsic semiconductor and/or a different conductivity type than the source/drain region of the bulk MOS transistor.

21. The device of claim 20, wherein the semiconductor plug comprises a p-type conductivity, and wherein the source/drain region of the bulk MOS transistor comprises an n-type conductivity.

22. The device of claim 19, wherein the semiconductor plug is directly on the source/drain region of the thin-film transistor.

23. The device of claim 16, wherein the bulk MOS transistor is an n-channel metal oxide semiconductor (NMOS) transistor, and the thin film transistor is a p-channel metal oxide semiconductor (PMOS) transistor.

24. The device of claim 16, wherein the thin-film transistor is a first thin-film transistor, and further comprising:
a second thin-film transistor on the insulating layer adjacent the first thin-film transistor,
wherein the metal plug is directly on a gate electrode of the second thin-film transistor.

25. The device of claim 24, wherein the bulk MOS transistor is a first bulk MOS transistor, wherein the metal plug is a first metal plug, and further comprising:
a second bulk MOS transistor on the substrate adjacent the first bulk MOS transistor; and
a second metal plug extending through at least a portion of the insulating layer and directly on the gate electrode of the second thin-film transistor and a gate electrode of the second bulk MOS transistor.

26. The device of claim 25, wherein the gate electrode of the second bulk MOS transistor is an n-type polysilicon pattern, and wherein the gate electrode of the second thin-film transistor is a p-type polysilicon pattern.

27. The device of claim 24, wherein the bulk MOS transistor is a driver transistor, wherein the first thin-film transistor is a load transistor, and wherein the second thin-film transistor is a transfer transistor for the static random-access memory device.

28. The device of claim 27, wherein a word line is connected to the gate electrode of the second thin-film transistor.

29. The device of claim 27, wherein a bit line is connected to a source/drain region of the second thin-film transistor.

30. The device of claim 16, wherein the insulating layer on the bulk MOS transistor is a first insulating layer, and further comprising:
a second insulating layer on the thin-film transistor, wherein the metal plug extends through the second insulating layer.

31. The device of claim 16, wherein the thin-film transistor includes a body portion having a single crystalline silicon structure.

32. The device of claim 31, wherein the body portion of the thin-film transistor is formed by a solid phase epitaxial process and has a same crystalline structure as the semiconductor plug.

33. The device of claim 16, wherein the metal plug comprises a tungsten plug.

34. The device of claim 16, wherein the metal plug comprises a tungsten plug and barrier metal layer surrounding the tungsten plug.

35. The interconnection structure of claim 16, wherein the contact hole in the insulating layer is free of oblique sidewalls.

36. The interconnection structure of claim 35, wherein the multi-layer plug is horizontally confined within a perimeter defined by the contact hole.

37. The interconnection structure of claim 16, wherein the multi-layer plug is horizontally confined within a perimeter defined by the contact hole.

38. A semiconductor device comprising an interconnection structure, the interconnection structure comprising:
a first transistor on a substrate having a first conductive region;
an insulating layer on the first conductive region and covering the first transistor, wherein the insulating layer includes a contact hole extending therethough;
a second transistor on the insulating layer having a second conductive region; and
a multi-plug vertically extending through the contact hole in the insulating layer to electrically connect the first conductive region and the second conductive region, the multi-plug comprising a silicon plug connected to the first conductive region through at least a portion of the insulating layer, and a metal plug connected to the silicon plug and the second conductive region through at least a portion of the insulating layer, wherein the multi-plug does not extend directly on the insulating layer outside the contact hole.

39. The semiconductor device of claim 38, wherein the first transistor is an NMOS transistor and the second transistor is a PMOS transistor.

40. The semiconductor device of claim 38, wherein the first and the second conductive regions are a source/drain region of the first and second transistors respectively.

41. The interconnection structure of claim 38, wherein the multi-plug is horizontally confined within a perimeter defined by the contact hole.

42. The interconnection structure of claim 38, wherein the contact hole in the insulating layer is free of oblique sidewalls.

43. A semiconductor device comprising an interconnection structure, the interconnection structure comprising:
a first transistor on a substrate having a first conductive region;
an insulating layer on the first conductive region and covering the first transistor, wherein the insulating layer includes a contact hole extending therethough;
a second transistor on the insulating layer having a second conductive region; and
a multi-plug vertically extending through the contact hole in the insulating layer to electrically connect the first conductive region and the second conductive region, the multi-plug comprising a first plug connected to the first conductive region and the second conductive region, and a second plug connected to the first conductive region and the second conductive region, wherein the first and the second plugs are directly connected to each other, and wherein the multi-plug does not extend directly on the insulating layer outside the contact hole.

44. The semiconductor device of claim 43, wherein the first transistor is an NMOS transistor and the second transistor is a PMOS transistor.

45. The semiconductor device of claim 43, wherein the first and the second conductive regions are a source/drain region of the first and second transistors, respectively.

46. The semiconductor device of claim 43, wherein the first plug comprises silicon and the second plug comprises metal.

47. The interconnection structure of claim 43, wherein the multi-plug is horizontally confined within a perimeter defined by the contact hole.

48. The interconnection structure of claim 43, wherein the contact hole in the insulating layer is free of oblique sidewalls.

* * * * *